(12) United States Patent
Knapp et al.

(10) Patent No.: US 9,651,632 B1
(45) Date of Patent: May 16, 2017

(54) ILLUMINATION DEVICE AND TEMPERATURE CALIBRATION METHOD

(71) Applicant: Ketra, Inc., Austin, TX (US)

(72) Inventors: David J. Knapp, Austin, TX (US);
Horace C. Ho, Austin, TX (US);
Joseph A. Savage, Cedar Park, TX (US)

(73) Assignee: Ketra, Inc., Austin, TX (US)

( * ) Notice: Subject to any disclaimer, the term of this patent is extended or adjusted under 35 U.S.C. 154(b) by 189 days.

(21) Appl. No.: 13/970,964

(22) Filed: Aug. 20, 2013

(51) Int. Cl.
H05B 33/08 (2006.01)
G01R 31/44 (2006.01)
H05B 37/02 (2006.01)

(52) U.S. Cl.
CPC ......... *G01R 31/44* (2013.01); *H05B 33/0869* (2013.01); *H05B 33/0848* (2013.01); *H05B 33/0854* (2013.01); *H05B 33/0866* (2013.01)

(58) Field of Classification Search
CPC  H05B 33/0866; H05B 33/086; H05B 33/089; H05B 37/02; H05B 41/16; H05B 33/0863; H05B 37/0254; G01K 7/01; G01K 15/00; Y02B 20/341
USPC ......... 315/307, 308, 149–159, 311, 86, 210; 348/801; 324/414; 374/1, 178
See application file for complete search history.

(56) References Cited

U.S. PATENT DOCUMENTS

| | | | |
|---|---|---|---|
| 4,029,976 | A | 6/1977 | Fish et al. |
| 4,402,090 | A | 8/1983 | Gfeller et al. |
| 4,713,841 | A | 12/1987 | Porter et al. |
| 4,745,402 | A | 5/1988 | Auerbach |

(Continued)

FOREIGN PATENT DOCUMENTS

| | | |
|---|---|---|
| CN | 1291282 | 4/2001 |
| CN | 1396616 | 2/2003 |

(Continued)

OTHER PUBLICATIONS

LED Fundamentals How to read a Datasheet Aug. 19, 2011 OSRAM Opto Semiconductors.*

(Continued)

*Primary Examiner* — Alexander H Taningco
*Assistant Examiner* — Renan Luque
(74) *Attorney, Agent, or Firm* — Kevin L. Daffer; Matheson Keys Daffer & Kordzik PLLC

(57) ABSTRACT

An illumination device comprising a plurality of light emitting diodes (LEDs) and a method for calibrating the illumination device is provided herein. According to one embodiment, the method may include subjecting a first LED to a first ambient temperature, measuring a forward voltage developed across the first LED upon applying a relatively small drive current to the first LED, detecting at least a first, a second and a third luminous flux output from the first LED upon successively applying at least a first, a second and a third drive current to the first LED, and storing results of the measuring and detecting steps within the illumination device to calibrate the first LED at the first ambient temperature. In some embodiments, the first LED may be subjected to a second ambient temperature, which is different from the first ambient temperature, and the method may repeat the steps of measuring, detecting and storing to calibrate the first LED at the second ambient temperature.

15 Claims, 12 Drawing Sheets

(56) References Cited

U.S. PATENT DOCUMENTS

| | | |
|---|---|---|
| 4,809,359 A | 2/1989 | Dockery |
| 5,018,057 A | 5/1991 | Biggs et al. |
| 5,103,466 A | 4/1992 | Bazes |
| 5,181,015 A | 1/1993 | Marshall et al. |
| 5,193,201 A | 3/1993 | Tymes |
| 5,218,356 A | 6/1993 | Knapp |
| 5,299,046 A | 3/1994 | Spaeth et al. |
| 5,317,441 A | 5/1994 | Sidman |
| 5,541,759 A | 7/1996 | Neff et al. |
| 5,619,262 A | 4/1997 | Uno |
| 5,657,145 A | 8/1997 | Smith |
| 5,797,085 A | 8/1998 | Beuk et al. |
| 5,905,445 A | 5/1999 | Gurney et al. |
| 6,016,038 A | 1/2000 | Mueller et al. |
| 6,067,595 A | 5/2000 | Lindenstruth |
| 6,069,929 A | 5/2000 | Yabe et al. |
| 6,084,231 A | 7/2000 | Popat |
| 6,094,014 A | 7/2000 | Bucks et al. |
| 6,094,340 A | 7/2000 | Min |
| 6,108,114 A | 8/2000 | Gilliland et al. |
| 6,127,783 A | 10/2000 | Pashley et al. |
| 6,147,458 A | 11/2000 | Bucks et al. |
| 6,150,774 A | 11/2000 | Mueller et al. |
| 6,234,645 B1 | 5/2001 | Borner et al. |
| 6,234,648 B1 | 5/2001 | Borner et al. |
| 6,250,774 B1 | 6/2001 | Begemann et al. |
| 6,333,605 B1 | 12/2001 | Grouev et al. |
| 6,344,641 B1 | 2/2002 | Blalock et al. |
| 6,356,774 B1 | 3/2002 | Bernstein et al. |
| 6,359,712 B1 | 3/2002 | Kamitani |
| 6,384,545 B1 | 5/2002 | Lau |
| 6,396,815 B1 | 5/2002 | Greaves et al. |
| 6,414,661 B1 | 7/2002 | Shen et al. |
| 6,441,558 B1 | 8/2002 | Muthu et al. |
| 6,448,550 B1 | 9/2002 | Nishimura |
| 6,495,964 B1 | 12/2002 | Muthu et al. |
| 6,498,440 B2 | 12/2002 | Stam et al. |
| 6,513,949 B1 | 2/2003 | Marshall et al. |
| 6,577,512 B2 | 6/2003 | Tripathi et al. |
| 6,617,795 B2 | 9/2003 | Bruning |
| 6,636,003 B2 | 10/2003 | Rahm et al. |
| 6,639,574 B2 | 10/2003 | Scheibe |
| 6,664,744 B2 | 12/2003 | Dietz |
| 6,692,136 B2 | 2/2004 | Marshall et al. |
| 6,741,351 B2 | 5/2004 | Marshall et al. |
| 6,753,661 B2 | 6/2004 | Muthu et al. |
| 6,788,011 B2 | 9/2004 | Mueller et al. |
| 6,806,659 B1 | 10/2004 | Mueller et al. |
| 6,831,569 B2 | 12/2004 | Wang et al. |
| 6,831,626 B2 | 12/2004 | Nakamura et al. |
| 6,853,150 B2 | 2/2005 | Clauberg et al. |
| 6,879,263 B2 | 4/2005 | Pederson et al. |
| 6,965,205 B2 | 11/2005 | Piepgras et al. |
| 6,969,954 B2 | 11/2005 | Lys |
| 6,975,079 B2 | 12/2005 | Lys et al. |
| 7,006,768 B1 | 2/2006 | Franklin |
| 7,014,336 B1 | 3/2006 | Ducharme et al. |
| 7,038,399 B2 | 5/2006 | Lys et al. |
| 7,046,160 B2 | 5/2006 | Pederson et al. |
| 7,072,587 B2 | 7/2006 | Dietz et al. |
| 7,088,031 B2 | 8/2006 | Brantner et al. |
| 7,119,500 B2 | 10/2006 | Young |
| 7,135,824 B2 | 11/2006 | Lys et al. |
| 7,161,311 B2 | 1/2007 | Mueller et al. |
| 7,166,966 B2 | 1/2007 | Naugler, Jr. et al. |
| 7,194,209 B1 | 3/2007 | Robbins et al. |
| 7,233,115 B2 | 6/2007 | Lys |
| 7,233,831 B2 | 6/2007 | Blackwell |
| 7,252,408 B2 | 8/2007 | Mazzochette et al. |
| 7,255,458 B2 | 8/2007 | Ashdown |
| 7,256,554 B2 | 8/2007 | Lys |
| 7,262,559 B2 | 8/2007 | Tripathi et al. |
| 7,294,816 B2 | 11/2007 | Ng et al. |
| 7,315,139 B1 | 1/2008 | Selvan et al. |
| 7,319,298 B2 | 1/2008 | Jungwirth et al. |
| 7,329,998 B2 | 2/2008 | Jungwirth |
| 7,330,002 B2 | 2/2008 | Joung |
| 7,330,662 B2 | 2/2008 | Zimmerman |
| 7,352,972 B2 | 4/2008 | Franklin |
| 7,358,706 B2 | 4/2008 | Lys |
| 7,359,640 B2 | 4/2008 | Onde et al. |
| 7,362,320 B2 | 4/2008 | Payne et al. |
| 7,372,859 B2 | 5/2008 | Hall et al. |
| 7,400,310 B2 | 7/2008 | LeMay |
| 7,445,340 B2 | 11/2008 | Conner et al. |
| 7,511,695 B2 | 3/2009 | Furukawa et al. |
| 7,525,611 B2 | 4/2009 | Zagar et al. |
| 7,554,514 B2 | 6/2009 | Nozawa |
| 7,573,210 B2 | 8/2009 | Ashdown et al. |
| 7,583,901 B2 | 9/2009 | Nakagawa et al. |
| 7,606,451 B2 | 10/2009 | Morita |
| 7,607,798 B2 | 10/2009 | Panotopoulos |
| 7,619,193 B2 | 11/2009 | Deurenberg |
| 7,649,527 B2 | 1/2010 | Cho et al. |
| 7,659,672 B2 | 2/2010 | Yang |
| 7,683,864 B2 | 3/2010 | Lee et al. |
| 7,701,151 B2 | 4/2010 | Petrucci et al. |
| 7,737,936 B2 | 6/2010 | Daly |
| 7,828,479 B1 | 11/2010 | Aslan et al. |
| 8,013,538 B2 | 9/2011 | Zampini et al. |
| 8,018,135 B2 | 9/2011 | Van De Ven et al. |
| 8,040,299 B2 | 10/2011 | Kretz et al. |
| 8,044,899 B2 | 10/2011 | Ng et al. |
| 8,044,918 B2 | 10/2011 | Choi |
| 8,057,072 B2 | 11/2011 | Takenaka et al. |
| 8,075,182 B2 | 12/2011 | Dai et al. |
| 8,076,869 B2 | 12/2011 | Shatford et al. |
| 8,159,150 B2 | 4/2012 | Ashdown et al. |
| 8,174,197 B2 | 5/2012 | Ghanem et al. |
| 8,174,205 B2 | 5/2012 | Myers et al. |
| 8,264,171 B1 * | 9/2012 | Domer .............. H05B 33/0854 315/291 |
| 8,283,876 B2 | 10/2012 | Ji |
| 8,299,722 B2 | 10/2012 | Melanson |
| 8,362,707 B2 | 1/2013 | Draper et al. |
| 8,471,496 B2 | 6/2013 | Knapp |
| 8,521,035 B2 | 8/2013 | Knapp et al. |
| 8,556,438 B2 | 10/2013 | McKenzie et al. |
| 8,569,974 B2 | 10/2013 | Chobot |
| 8,595,748 B1 | 11/2013 | Haggerty et al. |
| 8,633,655 B2 | 1/2014 | Kao et al. |
| 8,653,758 B2 | 2/2014 | Radermacher et al. |
| 8,680,787 B2 | 3/2014 | Veskovic |
| 8,704,666 B2 | 4/2014 | Baker, Jr. |
| 8,721,115 B2 | 5/2014 | Ing et al. |
| 8,749,172 B2 | 6/2014 | Knapp |
| 8,773,032 B2 | 7/2014 | May et al. |
| 8,791,647 B2 | 7/2014 | Kesterson et al. |
| 8,816,600 B2 | 8/2014 | Elder |
| 8,911,160 B2 | 12/2014 | Seo et al. |
| 2001/0020123 A1 | 9/2001 | Diab et al. |
| 2001/0030668 A1 | 10/2001 | Erten et al. |
| 2002/0014643 A1 | 2/2002 | Kubo et al. |
| 2002/0033981 A1 | 3/2002 | Keller et al. |
| 2002/0047624 A1 | 4/2002 | Stam et al. |
| 2002/0049933 A1 | 4/2002 | Nyu |
| 2002/0134908 A1 | 9/2002 | Johnson |
| 2002/0138850 A1 | 9/2002 | Basil et al. |
| 2002/0171608 A1 | 11/2002 | Kanai et al. |
| 2003/0103413 A1 | 6/2003 | Jacobi, Jr. et al. |
| 2003/0122749 A1 | 7/2003 | Booth, Jr. et al. |
| 2003/0133491 A1 * | 7/2003 | Shih .............................. 374/163 |
| 2003/0179721 A1 | 9/2003 | Shurmantine et al. |
| 2004/0044709 A1 | 3/2004 | Cabrera et al. |
| 2004/0052076 A1 | 3/2004 | Mueller et al. |
| 2004/0052299 A1 | 3/2004 | Jay et al. |
| 2004/0101312 A1 | 5/2004 | Cabrera |
| 2004/0136682 A1 | 7/2004 | Watanabe |
| 2004/0201793 A1 | 10/2004 | Anandan et al. |
| 2004/0220922 A1 | 11/2004 | Lovison et al. |
| 2004/0257311 A1 | 12/2004 | Kanai et al. |
| 2005/0004727 A1 | 1/2005 | Remboski et al. |
| 2005/0030203 A1 | 2/2005 | Sharp et al. |
| 2005/0030267 A1 | 2/2005 | Tanghe et al. |

(56) References Cited

U.S. PATENT DOCUMENTS

| | | |
|---|---|---|
| 2005/0053378 A1 | 3/2005 | Stanchfield et al. |
| 2005/0077838 A1 | 4/2005 | Blumel |
| 2005/0110777 A1 | 5/2005 | Geaghan et al. |
| 2005/0169643 A1 | 8/2005 | Franklin |
| 2005/0200292 A1 | 9/2005 | Naugler, Jr. et al. |
| 2005/0207157 A1 | 9/2005 | Tani |
| 2005/0242742 A1 | 11/2005 | Cheang et al. |
| 2005/0265731 A1 | 12/2005 | Keum et al. |
| 2006/0145887 A1 | 7/2006 | McMahon |
| 2006/0164291 A1 | 7/2006 | Gunnarsson |
| 2006/0198463 A1 | 9/2006 | Godin |
| 2006/0220990 A1 | 10/2006 | Coushaine et al. |
| 2006/0227085 A1 | 10/2006 | Boldt, Jr. et al. |
| 2007/0040512 A1 | 2/2007 | Jungwirth et al. |
| 2007/0109239 A1 | 5/2007 | den Boer et al. |
| 2007/0132592 A1 | 6/2007 | Stewart et al. |
| 2007/0139957 A1 | 6/2007 | Haim et al. |
| 2007/0248180 A1 | 10/2007 | Bowman et al. |
| 2007/0254694 A1 | 11/2007 | Nakagwa et al. |
| 2007/0279346 A1 | 12/2007 | den Boer et al. |
| 2008/0061717 A1 | 3/2008 | Bogner et al. |
| 2008/0107029 A1 | 5/2008 | Hall et al. |
| 2008/0120559 A1 | 5/2008 | Yee |
| 2008/0136334 A1 | 6/2008 | Robinson et al. |
| 2008/0136770 A1 | 6/2008 | Peker et al. |
| 2008/0136771 A1 | 6/2008 | Chen et al. |
| 2008/0150864 A1 | 6/2008 | Bergquist |
| 2008/0186898 A1 | 8/2008 | Petite |
| 2008/0222367 A1 | 9/2008 | Co |
| 2008/0235418 A1 | 9/2008 | Werthen et al. |
| 2008/0253766 A1 | 10/2008 | Yu et al. |
| 2008/0265799 A1 | 10/2008 | Sibert |
| 2008/0297070 A1 | 12/2008 | Kuenzler et al. |
| 2008/0304833 A1 | 12/2008 | Zheng |
| 2008/0309255 A1 | 12/2008 | Myers et al. |
| 2008/0317475 A1 | 12/2008 | Pederson et al. |
| 2009/0026978 A1 | 1/2009 | Robinson |
| 2009/0040154 A1 | 2/2009 | Scheibe |
| 2009/0049295 A1 | 2/2009 | Erickson et al. |
| 2009/0051496 A1 | 2/2009 | Pahlavan et al. |
| 2009/0121238 A1 | 5/2009 | Peck |
| 2009/0171571 A1 | 7/2009 | Son et al. |
| 2009/0196282 A1 | 8/2009 | Fellman et al. |
| 2009/0245101 A1 | 10/2009 | Kwon et al. |
| 2009/0278789 A1 | 11/2009 | Declercq et al. |
| 2009/0284511 A1 | 11/2009 | Takasugi et al. |
| 2009/0303972 A1 | 12/2009 | Flammer, III et al. |
| 2010/0005533 A1 | 1/2010 | Shamir |
| 2010/0054748 A1 | 3/2010 | Sato |
| 2010/0061734 A1 | 3/2010 | Knapp |
| 2010/0096447 A1 | 4/2010 | Kwon et al. |
| 2010/0134021 A1 | 6/2010 | Ayres |
| 2010/0134024 A1 | 6/2010 | Brandes |
| 2010/0141159 A1 | 6/2010 | Shiu et al. |
| 2010/0182294 A1 | 7/2010 | Roshan et al. |
| 2010/0188443 A1 | 7/2010 | Lewis et al. |
| 2010/0188972 A1 | 7/2010 | Knapp |
| 2010/0194299 A1 | 8/2010 | Ye et al. |
| 2010/0213856 A1 | 8/2010 | Mizusako |
| 2010/0272437 A1 | 10/2010 | Yoon et al. |
| 2010/0301777 A1 | 12/2010 | Kraemer |
| 2010/0327764 A1 | 12/2010 | Knapp |
| 2011/0031894 A1 | 2/2011 | Van De Ven |
| 2011/0044343 A1 | 2/2011 | Sethuram et al. |
| 2011/0052214 A1 | 3/2011 | Shimada et al. |
| 2011/0062874 A1 | 3/2011 | Knapp |
| 2011/0063214 A1 | 3/2011 | Knapp |
| 2011/0063268 A1 | 3/2011 | Knapp |
| 2011/0068699 A1 | 3/2011 | Knapp |
| 2011/0069094 A1 | 3/2011 | Knapp |
| 2011/0069960 A1 | 3/2011 | Knapp et al. |
| 2011/0133654 A1 | 6/2011 | McKenzie et al. |
| 2011/0148315 A1 | 6/2011 | Van Der Veen et al. |
| 2011/0150028 A1* | 6/2011 | Nguyen Hoang et al. ....... 374/1 |
| 2011/0241572 A1* | 10/2011 | Zhang ................ H05B 33/0854 315/308 |
| 2011/0248640 A1 | 10/2011 | Welten |
| 2011/0253915 A1 | 10/2011 | Knapp |
| 2011/0299854 A1 | 12/2011 | Jonsson et al. |
| 2011/0309754 A1 | 12/2011 | Ashdown et al. |
| 2012/0056545 A1 | 3/2012 | Radermacher et al. |
| 2012/0153839 A1* | 6/2012 | Farley et al. ................. 315/152 |
| 2012/0229032 A1 | 9/2012 | Van De Ven et al. |
| 2012/0286694 A1* | 11/2012 | Elder ................. H05B 33/0818 315/287 |
| 2012/0299481 A1 | 11/2012 | Stevens |
| 2012/0306370 A1 | 12/2012 | Van De Ven et al. |
| 2013/0016978 A1 | 1/2013 | Son et al. |
| 2013/0088522 A1 | 4/2013 | Gettemy et al. |
| 2013/0201690 A1 | 8/2013 | Vissenberg et al. |
| 2013/0257314 A1 | 10/2013 | Alvord et al. |
| 2013/0293147 A1* | 11/2013 | Rogers et al. ................. 315/297 |
| 2014/0028377 A1 | 1/2014 | Rosik et al. |
| 2014/0225529 A1* | 8/2014 | Beczkowski ...... H05B 33/0866 315/297 |
| 2015/0022110 A1* | 1/2015 | Sisto .................... H05B 33/086 315/210 |
| 2015/0155459 A1* | 6/2015 | Ishihara .............. H01L 25/0753 362/294 |

FOREIGN PATENT DOCUMENTS

| | | |
|---|---|---|
| CN | 1573881 | 2/2005 |
| CN | 1650673 | 8/2005 |
| CN | 1849707 | 10/2006 |
| CN | 101083866 | 12/2007 |
| CN | 101150904 | 3/2008 |
| CN | 101331798 | 12/2008 |
| CN | 101458067 | 6/2009 |
| EP | 0196347 | 10/1986 |
| EP | 0456462 | 11/1991 |
| EP | 2273851 | 1/2011 |
| GB | 2307577 | 5/1997 |
| JP | 06-302384 | 10/1994 |
| JP | 08-201472 | 8/1996 |
| JP | 11-025822 | 1/1999 |
| JP | 2001-514432 | 9/2001 |
| JP | 2004-325643 | 11/2004 |
| JP | 2005-539247 | 12/2005 |
| JP | 2006-260927 | 9/2006 |
| JP | 2007-266974 | 10/2007 |
| JP | 2007-267037 | 10/2007 |
| JP | 2008-507150 | 3/2008 |
| JP | 2008-300152 | 12/2008 |
| JP | 2009-134877 | 6/2009 |
| WO | 00/37904 | 6/2000 |
| WO | 03/075617 | 9/2003 |
| WO | 2005/024898 | 3/2005 |
| WO | 2007/069149 | 6/2007 |
| WO | 2008/065607 | 6/2008 |
| WO | 2008/129453 | 10/2008 |
| WO | 2010/124315 | 11/2010 |
| WO | 2012/005771 | 1/2012 |
| WO | 2012/042429 | 4/2012 |
| WO | 2013/142437 | 9/2013 |

OTHER PUBLICATIONS

Final Office Action mailed Jan. 28, 2015 for U.S. Appl. No. 12/806,117.
Office Action mailed Mar. 6, 2015 for U.S. Appl. No. 13/773,322.
Office Action mailed Feb. 2, 2015 for CN Application 201080035731.X.
Office Action mailed Jul. 1, 2014 for JP Application 2012-520587.
Office Action mailed Feb. 17, 2015 for JP Application 2012-520587.
Notice of Allowance mailed Jan. 28, 2014 for U.S. Appl. No. 13/178,686.
Notice of Allowance mailed Feb. 21, 2014 for U.S. Appl. No. 12/806,118.
Office Action mailed Mar. 11, 2014 for JP Application 2012-523605.

(56) References Cited

OTHER PUBLICATIONS

Office Action mailed Sep. 24, 2014 for JP Application 2012-523605.
Office Action mailed Mar. 25, 2015 for U.S. Appl. No. 14/305,472.
Notice of Allowance mailed Mar. 30, 2015 for U.S. Appl. No. 14/097,355.
Office Action mailed Apr. 8, 2015 for U.S. Appl. No. 14/305,456.
Notice of Allowance mailed May 22, 2015 for U.S. Appl. No. 14/510,212.
Office Action mailed May 27, 2015 for U.S. Appl. No. 12/806,117.
Partial International Search Report mailed Mar. 27, 2015 for PCT/US2014/068556.
Office Action mailed Apr. 22, 2014 for U.S. Appl. No. 12/806,114.
Final Office Action mailed Jun. 18, 2014 for U.S Appl. No. 13/231,077.
Office Action mailed Jun. 23, 2014 for U.S. Appl. No. 12/806,117.
Notice of Allowance mailed Aug. 21, 2014 for U.S. Appl. No. 12/584,143.
Office Action mailed Sep. 10, 2014 for U.S. Appl. No. 12/803,805.
"Color Management of a Red, Green, and Blue LED Combinational Light Source," Avago Technologies, Mar. 2010, pp. 1-8.
Hall et al., "Jet Engine Control Using Ethernet with a BRAIN (Postprint)," AIAA/ASME/SAE/ASEE Joint Propulsion Conference and Exhibition, Jul. 2008, pp. 1-18.
Kebemou, "A Partitioning-Centric Approach for the Modeling and the Methodical Design of Automotive Embedded System Architectures," Dissertation of Technical University of Berlin, 2008, 176 pages.
O'Brien et al., "Visible Light Communications and Other Developments in Optical Wireless," Wireless World Research Forum, 2006, 26 pages.
Zalewski et al., "Safety Issues in Avionics and Automotive Databuses," IFAC World Congress, Jul. 2005, 6 pages.
"Visible Light Communication: Tutorial," Project IEEE P802.15 Working Group for Wireless Personal Area Networks (WPANs), Mar. 2008.
Johnson, "Visible Light Communications," CTC Tech Brief, Nov. 2009, 2 pages.
Chonko, "Use Forward Voltage Drop to Measure Junction Temperature," Dec. 2005, (c) 2013 Penton Media, Inc., 5 pages.
International Search Report & Written Opinion, PCT/US2010/000219, mailed Oct. 12, 2010.
International Search Report & Written Opinion, PCT/US2010/002171, mailed Nov. 24, 2010.
International Search Report & Written Opinion, PCT/US2010/004953, mailed Mar. 22, 2010.
International Search Report & Written Opinion, PCT/US2010/001919, mailed Feb. 24, 2011.
Office Action mailed May 12, 2011 for U.S. Appl. No. 12/360,467.
Final Office Action mailed Nov. 28, 2011 for U.S. Appl. No. 12/360,467.
Notice of Allowance mailed Jan. 20, 2012 for U.S. Appl. No. 12/360,467.
Office Action Mailed Feb. 1, 2012 for U.S. Appl. No. 12/584,143.
Final Office Action Mailed Sep. 12, 2012 for U.S. Appl. No. 12/584,143.
Office Action Mailed Aug. 2, 2012 for U.S. Appl. No. 12/806,114.
Office Action Mailed Oct. 2, 2012 for U.S. Appl. No. 12/806,117.
Office Action Mailed Jul. 11, 2012 for U.S. Appl. No. 12/806,121.
Final Office Action Mailed Oct. 11, 2012 for U.S. Appl. No. 12/806,121.
Office Action mailed Dec. 17, 2012 for U.S. Appl. No. 12/806,118.
Office Action mailed Oct. 9, 2012 for U.S. Appl. No. 12/806,126.
Office Action mailed Jul. 10, 2012 for U.S. Appl. No. 12/806,113.
Notice of Allowance mailed Oct. 15, 2012 for U.S. Appl. No. 12/806,113.
International Search Report & Written Opinion mailed Sep. 19, 2012 for PCT/US2012/045392.
Partial International Search Report mailed Nov. 16, 2012 for PCT/US2012/052774.
International Search Report & Written Opinion for PCT/US2012/052774 mailed Feb. 4, 2013.
Notice of Allowance mailed Feb. 4, 2013 for U.S. Appl. No. 12/806,113.
Notice of Allowance mailed Feb. 25, 2013 for U.S. Appl. No. 12/806,121.
Notice of Allowance mailed May 3, 2013 for U.S. Appl. No. 12/806,126.
International Search Report & Written Opinion, PCT/US2013/027157, May 16, 2013.
Office Action mailed Jun. 10, 2013 for U.S. Appl. No. 12/924,628.
Final Office Action mailed Jun. 14, 2013 for U.S. Appl. No. 12/806,117.
Office Action mailed Jun. 27, 2013 for U.S. Appl. No. 13/178,686.
Final Office Action mailed Jul. 9, 2013 for U.S. Appl. No. 12/806,118.
Office Action mailed Oct. 24, 2013 for U.S. Appl. No. 12/806,117.
Notice of Allowance mailed Oct. 31, 2013 for U.S. Appl. No. 12/924,628.
Office Action mailed Nov. 12, 2013 for U.S. Appl. No. 13/231,077.
Office Action mailed Dec. 4, 2013 for U.S. Appl. No. 12/803,805.
Office Action mailed Nov. 4, 2013 for CN Application No. 201080032373.7.
Bouchet et al., "Visible-light communication system enabling 73 Mb/s data streaming," IEEE Globecom Workshop on Optical Wireless Communications, 2010, pp. 1042-1046.
Notice of Allowance for U.S. Appl. No. 14/604,886 mailed Sep. 25, 2015.
Notice of Allowance for U.S. Appl. No. 14/604,881 mailed Oct. 9, 2015.
International Search Report & Written Opinion for PCT/US2015/037660 mailed Oct. 28, 2015.
Office Action for U.S. Appl. No. 14/573,207 mailed Nov. 4, 2015.
Notice of Allowance for U.S. Appl. No. 14/510,243 mailed Nov. 6, 2015.
Notice of Allowance for U.S. Appl. No. 12/806,117 mailed Nov. 18, 2015.
Partial International Search Report for PCT/US2015/045252 mailed Nov. 18, 2015.
Office Action for U.S. Appl. No. 13/970,990 mailed Aug. 20, 2015.
Partial International Search Report for PCT/US2015/037660 mailed Aug. 21, 2015.
Final Office Action for U.S. Appl. No. 13/773,322 mailed Sep. 2, 2015.
Notice of Allowance for U.S. Appl. No. 13/970,944 mailed Sep. 11, 2015.
International Search Report & Written Opinion for PCT/US2014/068556 mailed Jun. 22, 2015.
Final Office Action for U.S. Appl. No. 12/803,805 mailed Jun. 23, 2015.
Office Action for U.S. Appl. No. 14/510,243 mailed Jul. 28, 2015.
Office Action for U.S. Appl. No. 14/510,283 mailed Jul. 29, 2015.
Office Action for U.S. Appl. No. 14/510,266 mailed Jul. 31, 2015.

\* cited by examiner

|     | Vf0       | Vf1       |
| --- | --------- | --------- |
| I0  | L(I0,Vf0) | L(I0,Vf1) |
| I1  | L(I1,Vf0) | L(I1,Vf1) |
| I2  | L(I2,Vf0) | L(I2,Vf1) |

ILLUMINATION DEVICE AND TEMPERATURE CALIBRATION METHOD

BACKGROUND OF THE INVENTION

1. Field of the Invention

This invention relates to illumination devices and, more particularly, to illumination devices comprising a plurality of light emitting diodes (LEDs) and to methods for calibrating and compensating individual LEDs in an illumination device, so as to maintain a desired luminous flux and/or a desired color point of the device over variations in temperature and process while avoiding undesirable visual artifacts, such as brightness banding and flicker.

2. Description of the Relevant Art

The following descriptions and examples are provided as background only and are intended to reveal information that is believed to be of possible relevance to the present invention. No admission is necessarily intended, or should be construed, that any of the following information constitutes prior art impacting the patentable character of the subjected mater claimed herein.

Lamps and displays using LEDs (light emitting diodes) for illumination are becoming increasingly popular in many different markets. LEDs provide a number of advantages over traditional light sources, such as incandescent and fluorescent light bulbs, including low power consumption, long lifetime, no hazardous materials, and additional specific advantages for different applications. When used for general illumination, LEDs provide the opportunity to adjust the color (e.g., from white, to blue, to green, etc.) or the color temperature (e.g., from "warm white" to "cool white") to produce different lighting effects. In addition, LEDs are rapidly replacing the Cold Cathode Fluorescent Lamps (CCFL) conventionally used in many display applications (such as LCD backlights), due to the smaller form factor and wider color gamut provided by LEDs. Organic LEDs (OLEDs), which use arrays of multi-colored organic LEDs to produce light for each display pixel, are also becoming popular for many types of display devices.

Although LEDs have many advantages over conventional light sources, a disadvantage of LEDs is that their output characteristics tend to vary over temperature, process and time. For example, it is generally well known that the luminous flux, or the perceived power of light emitted by an LED, is directly proportional to the drive current supplied thereto. In many cases, the luminous flux of an LED is controlled by increasing/decreasing the drive current supplied to the LED to correspondingly increase/decrease the luminous flux. However, the luminous flux generated by an LED for a given drive current does not remain constant over temperature and time, and gradually decreases with increasing temperature and as the LED ages over time. Furthermore, the luminous flux tends to vary from batch-to-batch, and even from one LED to another in the same batch, due to process variations.

LED manufacturers try to compensate for process variations by sorting or binning the LEDs based on factory measured characteristics, such as chromacity (or color), luminous flux and forward voltage. However, binning alone cannot compensate for changes in LED output characteristics due to aging and temperature fluctuations during use of the LED device. In order to maintain a constant (or desired) luminous flux, it is usually necessary to adjust the drive current supplied to the LED to account for temperature variations and aging effects.

Many LED manufacturers have recognized a need for temperature compensation, and there are several different ways in which temperature compensation is currently implemented in today's LED devices. However, most of these implementations follow the same, or roughly the same, temperature compensation method. For example, most temperature compensation methods begin by measuring the temperature of an LED or a string of LEDs. In some cases, one or more temperature sensors may be arranged near the LEDs to measure the ambient temperature surrounding the LEDs, or heat sinks may be coupled to the backside of the LEDs to measure the heat generated thereby. While heat sinks are generally needed for thermal dissipation, adding temperature sensors to the chip unnecessarily increases the cost of the LED device and consumes valuable chip real estate. More importantly, the temperature sensors and heat sinks added to the chip often cannot provide an accurate temperature measurement for all LEDs included with the LED device.

For example, many LED devices combine different colors of LEDs within the same package to produce a multi-colored LED device. An example of a multi-colored LED device is one in which two or more different colors of LEDs are combined to produce white or near-white light. There are many different types of white light lamps on the market, some of which combine red, green and blue (RGB) LEDs, red, green, blue and yellow (RGBY) LEDs, white and red (WR) LEDs, RGBW LEDs, etc. By combining different colors of LEDs within the same package, and driving the differently colored LEDs with different drive currents, these lamps may be configured to generate white light or near-white light within a wide gamut of color points or color temperatures ranging from "warm white" (e.g., roughly 2600K-3700K), to "neutral white" (e.g., 3700K-5000K) to "cool white" (e.g., 5000K-8300K).

However, the drive currents supplied to the differently colored LEDs in a multi-colored LED device can vary significantly from one another, depending on the desired color temperature. For instance, when an RGB lamp is configured for producing 2700K warm white light, the drive current supplied to the blue LEDs can be less than 10% of the drive current supplied to the red LEDs. Since an LED driven with a significantly higher drive current necessarily produces more thermal power, the junction temperature (i.e., the temperature of the active p-n region) of the red LEDs, in this instance, can be significantly greater than the junction temperatures of the blue and green LEDs. In some cases, the junction temperature of differently colored LEDs within the same package can differ by 5° C. or more, even with the same heat sink temperature. Therefore, it is usually more desirable to measure or estimate the LED junction temperatures, as opposed to the ambient or heat sink temperatures, and adjust the individual drive currents accordingly to maintain a precise color point produced by a multi-colored LED device.

It is generally well known that the forward voltage of an LED changes linearly with junction temperature when a fixed forward-biased drive current is supplied to the LED. FIG. 14 demonstrates the linear relationship between forward voltage and junction temperature with the forward voltages normalized to '1' at 25° C. (roughly room temperature). As shown in FIG. 14, the forward voltage developed across the LED junction decreases linearly as the junction temperature increases (and vice versa). As a consequence, LED forward voltages measured at a fixed drive current can be used to provide a fairly precise estimate of junction temperature for a particular LED.

However, most manufacturers of conventional LED devices fail to account for the fact that the magnitude and slope of the line correlating forward voltage to junction temperature (shown, e.g., in FIG. 14) can vary significantly between LED manufacturers, LED part numbers and even individual LEDs arranged side by side on the same chip. To illustrate this point, the dotted lines shown in FIG. 15 show a possible range of forward voltage versus temperature characteristics that may be seen from a particular manufacturer and part number, while the solid line indicates the forward voltage versus temperature line generated by an individual LED from that manufacturer and part number. As shown in FIG. 15, the magnitude of the forward voltage can vary significantly between individual LEDs at any given temperature. In addition, FIG. 15 shows that the slope of the line relating forward voltage to temperature can vary between individual LEDs. While the differences in slope are typically small, they can represent a few degrees C. measurement error over the operating temperature range of an LED. These measurement errors result in inaccurate temperature compensation if steps are not taken to account for these variations when calibrating conventional LED devices.

In addition to variations in forward voltage, most manufacturers fail to account for the non-linear relationship between luminous flux and junction temperature for certain colors of LEDs, and the non-linear relationship between luminous flux and drive current for all colors of LEDs. Without accounting for such non-linear behavior, conventional multi-color LED devices cannot be used to provide accurate temperature compensation for all LEDs included within the multi-color LED device.

For example, FIGS. 16 and 17 illustrate the relative change in luminous flux over junction temperature produced by differently colored LEDs supplied with fixed drive currents. As shown in FIG. 16, the luminous flux produced by green, blue and white LEDs changes relatively little and linearly with changes in junction temperature. However, FIG. 17 shows that the luminous flux produced by red, red-orange and, especially, yellow (amber) LEDs changes significantly and sometimes dramatically over temperature, and that these changes are substantially non-linear. In order to provide accurate temperature compensation, the drive currents supplied to each color of LED must be individually calibrated and adjusted during use of the device. Conventional multi-color LED devices fail to provide calibration and compensation for each color of LED used in the device, and thus, fail to provide accurate temperature compensation in a multi-color LED device.

FIGS. 18 and 19 illustrate typical relationships between luminous flux and LED drive current for different colors of LEDs (e.g., red, red-orange, white, blue and green LEDs). As shown in FIGS. 18 and 19, the relationship between luminous flux and LED drive current is non-linear for all colors of LEDs, and this non-linear relationship is substantially more pronounced for certain colors of LEDs (e.g., green LEDs). Without accounting for such non-linear behavior, conventional LED devices cannot be used to provide accurate temperature compensation for all LEDs included within the LED device.

In addition to failing to account for non-linear behavior and differences in output characteristics between individual LEDs, conventional LED devices typically use pulse width modulation (PWM) dimming to control the overall luminance of the LED device. In PWM dimming, the duty cycle of the drive current (i.e., the ratio of time the drive current is "on") is adjusted to control the overall luminance of the LED device. However, PWM dimming can be undesirable for a number of reasons. On a human level, pulse width modulation at certain frequencies has been shown to induce seizures and eye strain in some people. On a more technical level, PWM dimming causes issues for the power supply and the LEDs when switching large amounts of currents on and off. For example, in order to prevent the output voltage from varying too much, a larger output capacitor may need to be coupled across the power supply, which adds cost and consumes board space. However, this does not address the transients that occur in the drive currents supplied to the LEDs whenever the drive currents are turned on and off. In some cases, these transients can be visible in the form of flicker or color shift.

Another issue arises, not only when using PWM dimming, but whenever groups of LEDs are periodically turned on and off for any reason in an LED array. Whenever LEDs are periodically turned on and off, even at an imperceptibly high rate, an undesirable artifact called "brightness banding" occurs. This banding artifact is demonstrated in the photographs of FIGS. 20 and 21 as alternating bands of light and dark areas on a display screen backlit by an array of LEDs. The photograph shown in FIG. 20 was taken with a slow shutter speed to illustrate what the human eye sees, while the photograph shown in FIG. 21 was taken with a higher shutter speed to illustrate the bright and dark bands that develop across the display screen as a result of PWM dimming. This banding artifact also occurs when the light emitted by LEDs is modulated or turned on/off for other reasons, such as when modulating light output to communicate data optically in visible light communication (VLC) systems.

A need exists for improved illumination devices and methods for calibrating and compensating individual LEDs included within an illumination device, so as to maintain a desired luminous flux and/or color point of the device over variations in temperature and process. In order to overcome the disadvantages and inaccuracies associated with conventional methods, the calibration and compensation methods described herein take into account and adjust for variations in forward voltage magnitude and slope between individual LEDs, the non-linear relationship between luminous flux and junction temperature for certain colors of LEDs, and the non-linear relationship between luminous flux and drive current for all colors of LEDs. This enables the present invention to provide a more highly precise method of temperature compensation. Further, accurate temperature compensation is provided herein without producing undesirable visual artifacts, such as brightness banding, flicker and color shift.

SUMMARY OF THE INVENTION

The following description of various embodiments of an illumination device and a method for calibrating an illumination device is not to be construed in any way as limiting the subject matter of the appended claims.

According to one embodiment, a method is provided herein for calibrating individual LEDs in the illumination device, so that a desired luminous flux and/or a desired color point of the device can be maintained over variations in temperature and process during subsequent operation of the device. The illumination device may generally include a plurality of light emitting diodes (LEDs) or chains of LEDs. For the sake of simplicity, the term "LED" will be used herein to refer to a single LED or a chain of serially connected LEDs supplied with the same drive current.

In some cases, the calibration method described herein may include subjecting the illumination device to a first ambient temperature and measuring a forward voltage developed across each LED, one LED at a time, upon applying a relatively small drive current to the LED. As used herein, a relatively small drive current may be described as a non-operative drive current, or a drive current which is insufficient to produce significant illumination from the LED. In some cases, the relatively small drive current may range between about 0.1 mA and about 10 mA, depending on the type and size of LED being calibrated. For some common types of LEDs with one square millimeter of junction area, the relatively small drive current may range between about 0.3 mA and about 3 mA, for example. Using a relatively small (i.e., non-operative) drive current to obtain forward voltage measurements increases the accuracy of the calibration method and the subsequently performed compensation method by ensuring that the forward voltage measurements for a given temperature and fixed drive current do not change significantly over time.

In some cases, the calibration method may also include detecting a plurality of luminous flux values output from each LED, one LED at a time, upon successively applying a plurality of different drive currents to the LED. In general, the step of detecting may include detecting a number, N, of luminous flux output from the each LED upon successively applying N different drive currents to the each LED, one LED at a time, where the N different drive currents are each different from one another and substantially greater than the relatively small drive current, and where N is greater than or equal to 2.

The drive currents supplied to the LEDs to measure luminous flux are generally operative drive current levels (e.g., about 20 mA to about 500 mA), and thus, may be substantially greater than the relatively small, non-operative drive current (e.g., about 0.3 mA to about 3 mA) used to measure forward voltage. In some cases, increasingly greater drive current levels may be successively applied to the LEDs to obtain luminous flux measurements. In other cases, luminous flux may be detected upon successively applying decreasing levels of drive current to the LEDs. The order in which the drive current levels are applied during the luminous flux measurements is largely unimportant, only that the drive currents be different from one another.

In one embodiment, three luminous flux measurements (e.g., a first, a second and a third luminous flux) may be obtained from each LED upon successively applying at least a first, a second and a third drive current to the LED, wherein the first drive current is substantially equal to a maximum drive current associated with the LED, the second drive current is substantially less than the first drive current, and the third drive current is substantially less than the second drive current. In one example, the first drive current may be substantially equal to a maximum drive current (typically about 500 mA, depending on LED part number and manufacturer), the second drive current may be about 30% of the maximum drive current, and the third drive current may be about 10% of the maximum drive current. Although examples are provided herein, the calibration method is not limited to any particular value or any particular number of drive current levels, and may apply substantially any value and/or any number of drive current levels to an LED within the operating current level range of that LED.

Sometime after the forward voltage and luminous flux measurement values are obtained at the first ambient temperature, the results of the measuring and detecting steps may be stored within the illumination device so that the stored values can be later used to compensate the illumination device for changes in luminance and/or color point that may occur with variations in temperature and process. In one embodiment, the forward voltage and luminous flux measurement values obtained at the first ambient temperature may be stored within a table of calibration values.

In some cases, the calibration method may continue by subjecting the illumination device to a second ambient temperature, which is different from the first ambient temperature, and repeating the steps of measuring, detecting and storing to calibrate each of the plurality of LEDs at the second ambient temperature. In one embodiment, the second ambient temperature may be substantially less than the first ambient temperature. For example, the second ambient temperature may be approximately equal to room temperature (e.g., roughly 25° C.), and the first ambient temperature may be substantially greater than room temperature. In one example, the first ambient temperature may be closer to an elevated temperature (e.g., roughly 70° C.) or a maximum temperature (e.g., roughly 85° C.) at which the device is expected to operate. In an alternative embodiment, the second ambient temperature may be substantially greater than the first ambient temperature It is worth noting that the exact values, number and order in which the temperatures are applied to calibrate the individual LEDs is somewhat unimportant. However, it is generally desired to obtain the forward voltage and luminous flux measurements at a number of different temperatures, so that the forward voltage vs. junction temperature relationship and the luminous flux vs. drive current relationship can be accurately characterized across the operating temperature range of each LED. In one exemplary embodiment, the illumination device may be subjected to two (or more) substantially different ambient temperatures selected from across the operating temperature range of the illumination device.

In some embodiments, the illumination device may be subjected to the first and second ambient temperatures by artificially generating the temperatures during the calibration process. However, it is generally preferred that the first and second ambient temperatures are ones which occur naturally during production of the illumination device, as this simplifies the calibration process and significantly decreases the costs associated therewith.

According to another embodiment, an illumination device is provided herein with a plurality of light emitting diode (LED) chains, and a storage medium configured for storing a table of calibration values correlating forward voltage and drive current to luminous flux at a plurality of temperatures for each of the plurality of LED chains. The table of calibration values may be obtained using the calibration method described above. Thus, for each LED chain, the table of calibration values may include a first forward voltage value measured across the LED chain using a relatively small drive current when the LED chain is subjected to a first temperature, and a second forward voltage value measured across the LED chain using the relatively small drive current when the LED chain is subjected to a second temperature. In addition, the table of calibration values may further include a first plurality of luminous flux values detected from the LED chain using a plurality of different drive currents when the LED chain is subjected to the first temperature, and a second plurality of luminous flux values detected from the LED chain using the plurality of different drive currents when the LED chain is subjected to the second temperature.

In some cases, the illumination device may further include an interface for receiving the calibration values from a calibration tool. In one embodiment, the interface may be a wireless interface configured to communicate using radio frequency (RF), infrared (IR) light or visible light. In one example, the wireless interface may be configured to operate according to at least one of the ZigBee, WiFi, or Bluetooth communication protocols. In another embodiment, the interface may be a wired interface, which is configured to communicate over an AC mains, a dedicated conductor or a set of conductors.

BRIEF DESCRIPTION OF THE DRAWINGS

Other objects and advantages of the invention will become apparent upon reading the following detailed description and upon reference to the accompanying drawings.

Figure 1:
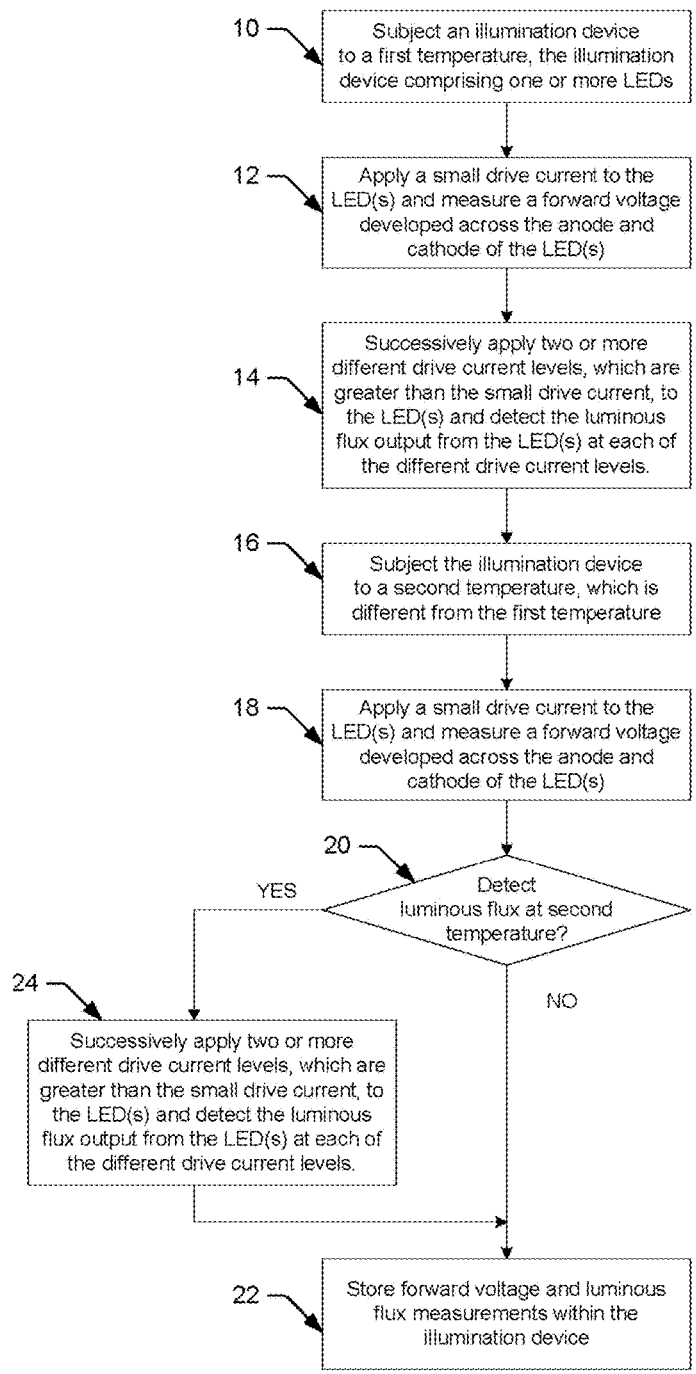
FIG. 1 is a flowchart diagram of an improved method for calibrating an illumination device comprising a plurality of LEDs, in accordance with one embodiment of the invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

An LED generally comprises a chip of semiconducting material doped with impurities to create a p-n junction. As in other diodes, current flows easily from the p-side, or anode, to the n-side, or cathode, but not in the reverse direction. Charge-carriers—electrons and holes—flow into the junction from electrodes with different voltages. When an electron meets a hole, it falls into a lower energy level, and releases energy in the form of a photon (i.e., light). The wavelength of the light emitted by the LED, and thus its color, depends on the band gap energy of the materials forming the p-n junction of the LED. Red and yellow LEDs are commonly composed of materials (e.g., AlInGaP) having a relatively low band gap energy, and thus produce longer wavelengths of light. For example, most red and yellow LEDs have a peak wavelength in the range of approximately 610-650 nm and approximately 580-600 nm, respectively. On the other hand, green and blue LEDs are commonly composed of materials (e.g., GaN or InGaN) having a larger band gap energy, and thus, produce shorter wavelengths of light. For example, most green and blue LEDs have a peak wavelength in the range of approximately 515-550 nm and approximately 450-490 nm, respectively.

When two or more differently colored LEDs are combined within a single package, the spectral content of the individual LEDs are combined to produce blended light. In some cases, differently colored LEDs may be combined to produce white light within a wide gamut of color points or correlated color temperatures (CCTs) ranging from "warm white" (e.g., roughly 2600K-3700K), to "neutral white" (e.g., 3700K-5000K) to "cool white" (e.g., 5000K-8300K). Examples of white light illumination devices include, but are not limited to, those that combine red, green and blue (RGB) LEDs, red, green, blue and yellow (RGBY) LEDs, white and red (WR) LEDs, and RGBW LEDs.

The present invention is generally directed to illumination devices having a plurality of light emitting diodes (LEDs), and provides improved methods for controlling output characteristics of the LEDs over variations in temperature and process. In some embodiments, the methods described herein may be used to control the luminous flux emitted from a plurality of LEDs, if the LEDs are all of the same color, or may be used to control the luminous flux and color point (or color temperature) of the LEDs, if the illumination device comprises two or more differently colored LEDs.

Although not limited to such, the present invention is particularly well suited to illumination devices in which two or more different colors of LEDs are combined to produce white light or near-white light, since the output characteristics of differently colored LEDs vary differently over temperature. The present invention is also particularly well suited to illumination devices that include LEDs with lower band gap energies, such as red, red-orange and yellow LEDs, as the output characteristics of these LEDs are particularly susceptible to variations in temperature.

Figure 16:
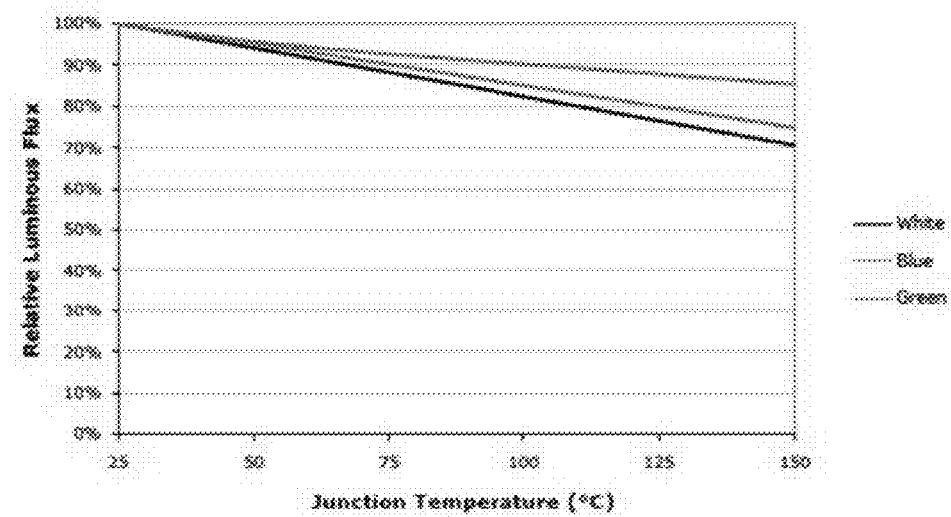
FIG. 16 is a graph illustrating the non-linear relationship between relative luminous flux and junction temperature for white, blue and green LEDs.
Figure 17:
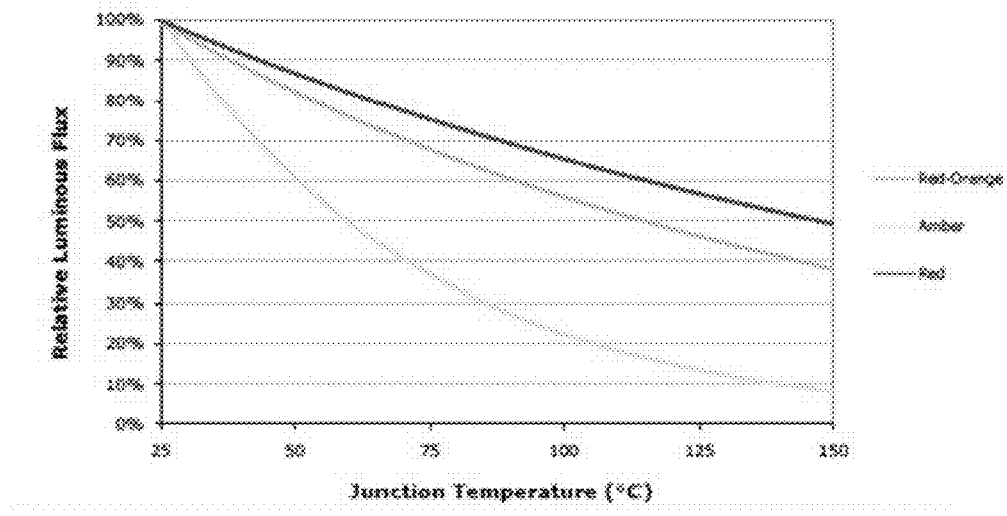
FIG. 17 is a graph illustrating the substantially more non-linear relationship between relative luminous flux and junction temperature for red, red-orange and yellow (amber) LEDs.

As shown in FIGS. 16-17, LEDs with lower band gap energies (e.g., red, red-orange and yellow LEDs) are more susceptible to variations in temperature than LEDs with larger band gap energies (e.g., white, blue and green). In particular, the luminous flux (i.e., a perceived power of the emitted light, measured in lumens) produced by red, red-orange and yellow LEDs decreases much faster as temperatures increase, than the luminous flux produced by white, blue and green LEDs. This is because there are fewer charge-carriers contributing to light emission in materials having lower band gap energies; thus, LEDs comprised of these materials generate less light (i.e., less luminous flux) when subjected to increasingly higher temperatures.

When LEDs comprised of significantly different band gap materials are combined within a single package, the color point of the resulting device may change significantly over variations in temperature. For example, when red, green and blue LEDs are combined within a white light illumination device, the color point of the device may appear increasingly "cooler" as the temperature rises. This is because the luminous flux produced by the red LEDs decreases significantly as temperatures increase, while the luminous flux produced by the green and blue LEDs remains relatively stable.

In order to maintain a constant luminous flux and a constant color point in a multi-colored LED device over changes in temperature and process, improved methods are needed to individually calibrate and compensate each color of LED used in the multi-colored illumination device. In particular, improved calibration and compensation methods are needed to overcome the disadvantages of conventional methods, which fail to provide accurate temperature compensation in a multi-colored LED device by failing to account for variations between individual LEDs, non-linear relationships between luminous flux and junction temperature, and non-linear relationships between luminous flux and drive current.

FIG. 1 illustrates one embodiment of an improved method for calibrating an illumination device comprising a plurality of LEDs or chains of LEDs. For the sake of simplicity, the term "LED" will be used herein to refer to a single LED or a chain of serially connected LEDs supplied with the same drive current. In some embodiments, the method shown in FIG. 1 may be used to calibrate an illumination device having LEDs all of the same color. However, the method may be particularly well-suited for calibrating an illumination device comprising two or more differently colored LEDs, since output characteristics of differently colored LEDs tend to differ from one another.

As shown in FIG. 1, the improved calibration method may begin by subjecting the illumination device to a first ambient temperature (in step 10). Once subjected to this temperature, a forward voltage measurement and a plurality of luminous flux measurements may be obtained from each of the LEDs included within the illumination device. For example, a relatively small drive current (e.g., approximately 0.1-10 mA) may be supplied to each of the LEDs, so that a forward voltage developed across the anode and cathode of the LEDs can be measured (in step 12). As used herein, a "relatively small drive current" may be broadly defined as a non-operative drive current, or a drive current level which is insufficient to produce significant illumination from the LED device.

Most LED manufacturers, which use forward voltage measurements to compensate for temperature variations, supply a relatively large drive current to the LEDs (e.g., an operative drive current level sufficient to produce illumination from the LEDs) when taking forward voltage measurements. Unfortunately, forward voltages measured at operative drive current levels tend to vary rather significantly over the lifetime of an LED. As an LED ages, the parasitic resistance within the junction increases, which in turn, causes the forward voltage measured at operating current levels to increase over time, regardless of temperature. For this reason, a relatively small (i.e., non-operative) drive current is used herein when obtaining forward voltage measurements—both within the calibration method of FIG. 1 and the compensation method of FIG. 4—to limit the resistive portion of the forward voltage drop. For some common types of LEDs with one square millimeter of junction area, the optimum drive current used to obtain forward voltage measurements in the presently described methods may be roughly 0.3-3 mA. However, smaller/larger LEDs may use proportionally less/more current to keep the current density roughly the same. As such, the optimum drive current level may fall within a range of approximately 0.1-10 mA.

Forward voltage measurements are taken (in step 12) by supplying a relatively small drive current to each LED, one LED at a time. When taking these measurements, all other emission LEDs in the illumination device are turned off to avoid inaccurate forward voltage measurements (since light from these LEDs would induce additional photocurrents in the LED being measured). The emission LEDs not currently under test may be turned off by cutting off the drive current supplied thereto, or at least reducing the supplied drive currents to a non-operative level.

In some embodiments, the calibration method may continue (in step 14) by measuring the luminous flux output from each LED at a plurality of different drive current levels.

Specifically, two or more different drive current levels may be successively applied to each LED, one LED at a time, and the luminous flux produced by each LED may be detected at each of the different drive current levels. In general, the drive currents used to measure luminous flux may be operative drive current levels (e.g., about 20 mA to about 500 mA), and thus, may be substantially greater than the relatively small, non-operative drive current (e.g., about 0.3 mA to about 3 mA) used to measure forward voltage.

Figure 3:
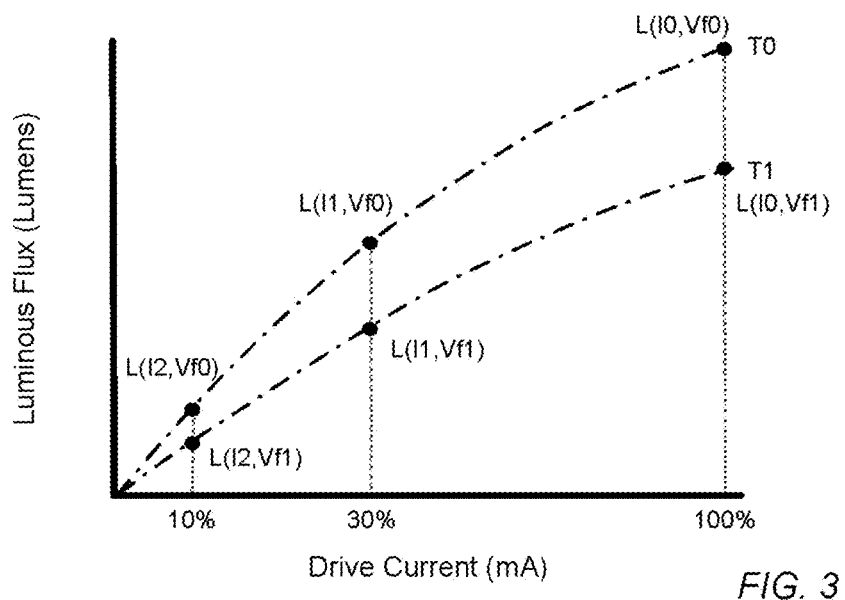
FIG. 3 is a graph illustrating exemplary luminous flux values measured from a given LED at three different drive currents and two different temperatures during the calibration method of FIG. 1, and the substantially non-linear relationship between luminous flux and drive current.

In some cases, increasingly greater drive current levels may be successively applied to each LED to obtain luminous flux measurements. In other cases, luminous flux may be detected upon successively applying decreasing levels of drive current to the LEDs. The order in which the drive current levels are applied during the luminous flux measurements is largely unimportant, only that the drive currents be different from one another. In one embodiment, three luminous flux measurements may be obtained from each LED at roughly a maximum drive current level (typically about 500 mA, depending on LED part number and manufacturer), roughly 30% of the maximum drive current, and roughly 10% of the maximum drive current, as shown in FIG. 3 and discussed below.

Although examples are provided herein, the present invention is not limited to any particular value or any particular number of drive current levels, and may apply substantially any value and any number of drive current levels to an LED within the operating current level range of that LED. However, it is generally desired to obtain the luminous flux measurements at a sufficient number of different drive current levels, so that a luminous flux vs. drive current relationship can be accurately characterized across the operating current level range of the LED during the compensation method of FIG. 4.

Figure 18:
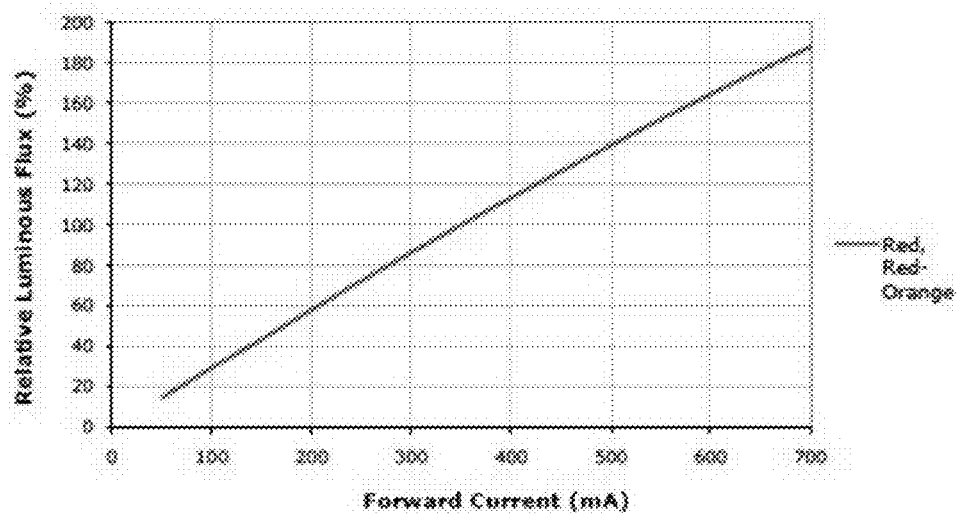
FIG. 18 is a graph illustrating the non-linear relationship between relative luminous flux and forward current for red and red-orange LEDs.

While increasing the number of luminous flux measurements improves the accuracy with which the relationship is characterized, it may also increase the calibration time and costs, and may not be desired in all cases. However, additional luminous flux measurements may be beneficial when attempting to characterize the luminous flux vs. drive current relationship for certain colors of LEDs. For instance, additional measurements may be beneficial when characterizing the luminous flux vs. drive current relationship for blue and green LEDs, which tend to exhibit a significantly more non-linear relationship (see, FIGS. 17-18) than other colors of LEDs. Thus, a balance should be struck between accuracy and calibration time/costs when selecting a desired number of drive current levels with which to obtain luminous flux measurements for a particular color of LED.

After the forward voltage measurement (step 12) and the plurality of luminous flux measurements (step 14) are obtained from each LED at the first temperature, the illumination device is subjected to a second ambient temperature, which is substantially different from the first ambient temperature (in step 16). Once subjected to this second temperature, the calibration method may obtain an additional forward voltage measurement (in step 18), and in some cases, a plurality of additional luminous flux measurements (in steps 20 and 24), from each LED. The forward voltage measurement and the plurality of (optional) luminous flux measurements may be obtained at the second ambient temperature in the same manner described above for the first ambient temperature. Once the measurements are obtained, the measurement values may be stored (in step 22) within the illumination device, so that the stored values can be later used to compensate the illumination device for changes in luminance and/or color point that may occur with variations in temperature and process. In one embodiment, the luminous flux vs. forward voltage at each drive current may be stored within a table of calibration values, as shown for example in FIG. 4 and discussed below.

In one embodiment, the second ambient temperature may be substantially less than the first ambient temperature. For example, the second ambient temperature may be approximately equal to room temperature (e.g., roughly 25° C.), and the first ambient temperature may be substantially greater than room temperature. In one example, the first ambient temperature may be closer to an elevated temperature (e.g., roughly 70° C.) or a maximum temperature (e.g., roughly 85° C.) at which the device is expected to operate. In an alternative embodiment, the second ambient temperature may be substantially greater than the first ambient temperature.

It is worth noting that the exact values, number and order in which the temperatures are applied to calibrate the individual LEDs is somewhat unimportant. However, it is generally desired to obtain the forward voltage and luminous flux measurements at a number of different temperatures, so that the forward voltage vs. junction temperature relationship and the luminous flux vs. drive current relationship can be accurately characterized across the operating temperature range of each LED. In one exemplary embodiment (shown, e.g., in FIGS. 2-3 and discussed below), the illumination device may be subjected to two (or more) substantially different ambient temperatures selected from across the operating temperature range of the illumination device.

In some embodiments, the illumination device may be subjected to the first and second ambient temperatures by artificially generating the temperatures during the calibration process. However, it is generally preferred that the first and second ambient temperatures are ones which occur naturally during production of the illumination device, as this simplifies the calibration process and significantly decreases the costs associated therewith. In one embodiment, the elevated temperature forward voltage and luminous flux measurements may be taken after burn-in of the LEDs when the illumination device is relatively hot (e.g., roughly 50° C. to 85° C.), and sometime thereafter (e.g., at the end of the manufacturing line), a room temperature calibration may be performed to measure the forward voltage and/or the luminous flux output from the LEDs when the illumination device is relatively cool (e.g., roughly 20° C. to 30° C.).

Figure 2:
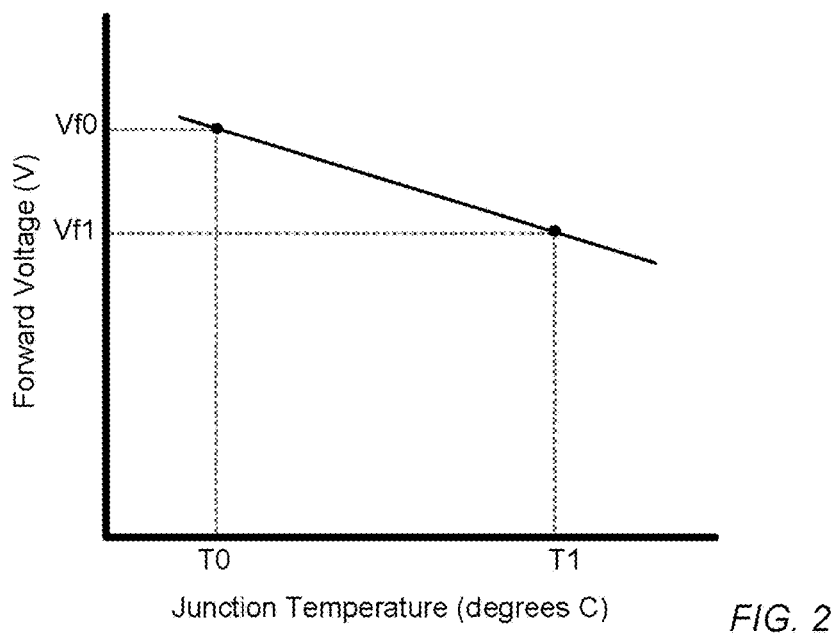
FIG. 2 is a graph illustrating exemplary forward voltage values measured from a given LED at two different temperatures during the calibration method of FIG. 1 and the linear relationship between forward voltage and temperature.

FIGS. 2 and 3 illustrate exemplary forward voltage and luminous flux measurement values that may be obtained from an individual LED by following the calibration method steps shown in FIG. 1 and described above. In exemplary embodiment of FIG. 2, two forward voltage measurements (Vf0, Vf1) are obtained from each LED, one LED at a time, upon subjecting the illumination device to two substantially different temperatures (T0, T1). While it is possible to measure the forward voltage of a given LED at three (or more) temperatures, doing so may add significant expense, complexity and/or time to the calibration process. Furthermore, calibrating the forward voltage measurements at additional temperatures may not significantly improve the accuracy of the calibration results, as the forward voltage vs. temperature relationship is highly linear for all LEDs. For these reasons, it is generally preferred that the forward voltage measurements be calibrated at two different temperatures (e.g., 25° C. and 70° C.) for each LED, so that the forward voltage calibration values can be later used during the compensation method.

In the exemplary embodiment of FIG. 3, six luminous flux measurements (L(I0, Vf0), L(I1,Vf0), L(I2, Vf0), L(I0, Vf1), L(I1, Vf1) and L(I2, Vf1)) are obtained for each LED by successively applying three different drive currents (e.g., I0, I1 and I2) to each LED, one LED at a time, upon subjecting the illumination device to two different temperatures (T0, T1). While it is possible to obtain luminous flux measurements at only one temperature, or even at three (or more) temperatures, it is generally preferred that the measurements be obtained at two temperatures, as shown in FIG. 3. While an exemplary number of drive current levels and values of drive current are shown in FIG. 3, the present invention is not limited to such examples. It is certainly possible to obtain a greater/lesser number of luminous flux measurements from each LED by applying a greater/lesser number of drive current levels to the individual LEDs. It is also possible to use substantially different values of drive current, other than those specifically illustrated in FIG. 3.

In some embodiments, the number of drive current levels and the particular values of the drive current used to obtain luminous flux measurements from a particular LED may be selected based upon the color of the LED being characterized. For example, the luminous flux vs. drive current relationships for some LED colors, such as blue and green, are comparatively more non-linear than other LED colors, such as red and red-orange (see, FIGS. 17-18). LED colors exhibiting substantially greater non-linear behaviors (such as blue and green) may be more accurately characterized by obtaining additional luminous flux measurements.

As noted above, the forward voltage and luminous flux values measured during steps 12, 14, 18 and 24 may be stored within the illumination device in step 22 of the calibration method of FIG. 1. In one embodiment, the calibration values may be stored within a table of calibration values, as shown for example in FIG. 4. The stored calibration values may then be used in the compensation method of FIG. 5 (discussed below) to adjust or maintain the luminous flux output from each individual LED. If the illumination device comprises multiple colors of LEDs, the stored calibration values may also be used to adjust or maintain the color point of the illumination device.

An exemplary method for calibrating an illumination device comprising a plurality of LEDs has now been described with reference to FIGS. 1-4. Although the method steps shown in FIG. 1 are described as occurring in a particular order, one or more of the steps of the illustrated method may be performed in a substantially different order. In one alternative embodiment, for example, the luminous flux output from the LEDs may be detected at two or more drive currents (e.g., in step 14) before the forward voltage is measured (e.g., in step 12) from the LEDs. In addition, while the embodiment shown in FIG. 1 indicates that forward voltage and luminous flux are measured at possibly two different temperatures, an alternative embodiment of the illustrated method may obtain such measurements at only one temperature, or more than two temperatures. Furthermore, while the illustrated method illustrates the forward voltage and luminous flux measurements as being stored at the end of the calibration method (e.g., in step 22), a skilled artisan would recognize that these values may be stored at substantially any time during the calibration process without departing from the scope of the invention. The calibration method described herein is considered to encompass all such variations and alternative embodiments.

The calibration method provided herein improves upon conventional calibration methods in a number of ways. First, the method described herein calibrates each LED (or chain of LEDs) individually, while turning off all emission LEDs not currently under test. This not only improves the accuracy of the forward voltage and luminous flux calibration values, but also enables the stored calibration values to account for process variations between individual LEDs, as well as differences in output characteristics that inherently occur between different colors of LEDs.

Accuracy is further improved herein by supplying a relatively small (i.e., non-operative) drive current to the LEDs when obtaining forward voltage measurements, as opposed to the operative drive current levels used in conventional calibration methods. By using non-operative drive currents to obtain the forward voltage calibration values, and again later to take forward voltage measurements during the compensation method, the present invention avoids inaccurate compensation by ensuring that the forward voltage measurements for a given temperature and fixed drive current do not change significantly over time (due to parasitic resistances in the junction when operative drive currents are used to obtain forward voltage measurements).

As another advantage, the calibration method described herein obtains a plurality of luminous flux measurements for each LED at a plurality of different drive current levels. This further improves calibration accuracy by enabling the non-linear relationship between luminous flux and drive current to be precisely characterized for each individual LED. Furthermore, obtaining forward voltage and luminous flux calibration values at a number of different temperatures improves compensation accuracy by enabling the compensation method (described below) to interpolate between the stored calibration values, so that accurate compensation values may be determined for current operating temperatures.

Figures 4, 6:
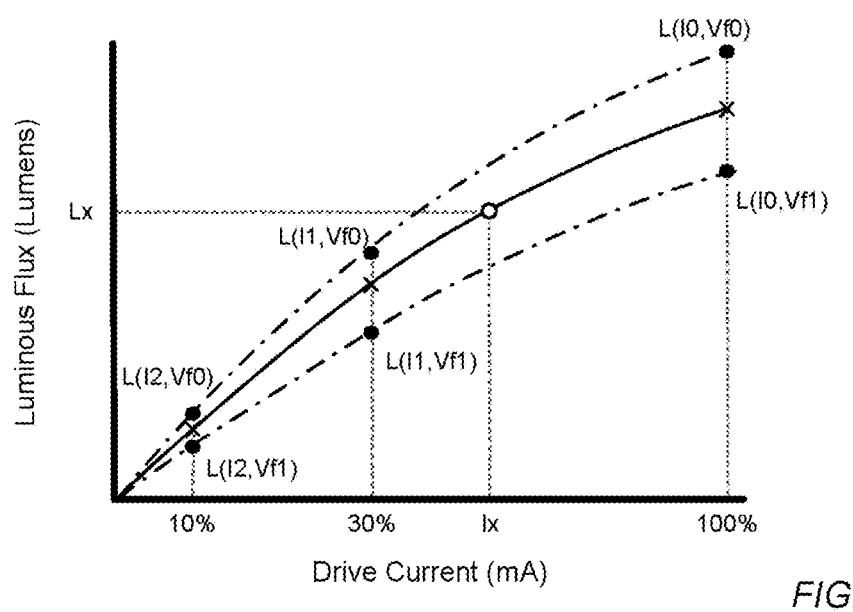
FIG. 4 is a chart illustrating an exemplary table of calibration values that may be obtained in accordance with the calibration method of FIG. 1 and stored within the illumination device.
FIG. 6 is a graphical representation depicting how interpolation technique(s) may be used in the compensation method of FIG. 5 to determine the drive current needed to produce a desired luminous flux for a given LED using the calibration values obtained during the calibration phase and stored within the illumination device.
Figure 5:
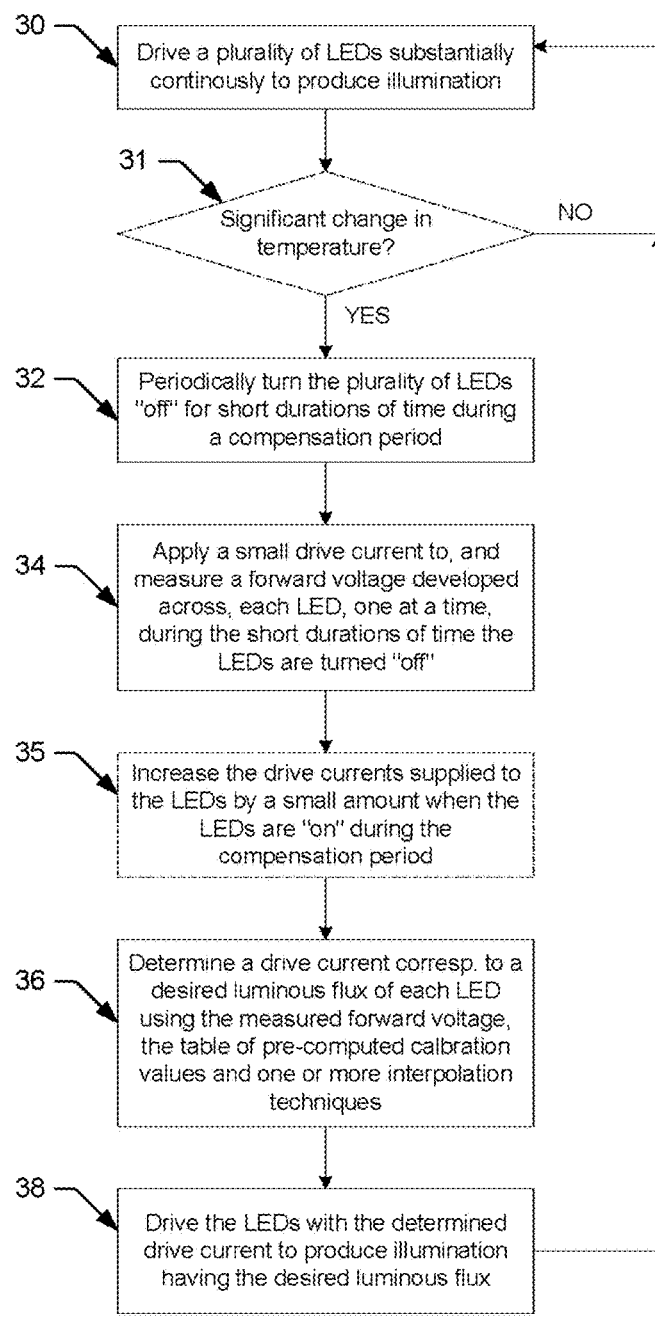
FIG. 5 is a flowchart diagram of an improved compensation method, in accordance with one embodiment of the invention.
Figure 7:
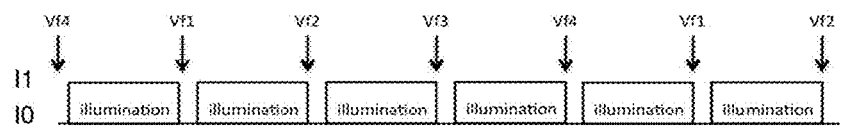
FIG. 7 is a timing diagram for an illumination device comprising four LEDs and illustrates how, in one embodiment of the compensation method shown in FIG. 5, the LEDs are driven substantially continuously to produce illumination, and the forward voltages developed across the LEDs are repeatedly measured, one LED at a time, during times when the plurality of LEDs are turned off.
Figure 8:
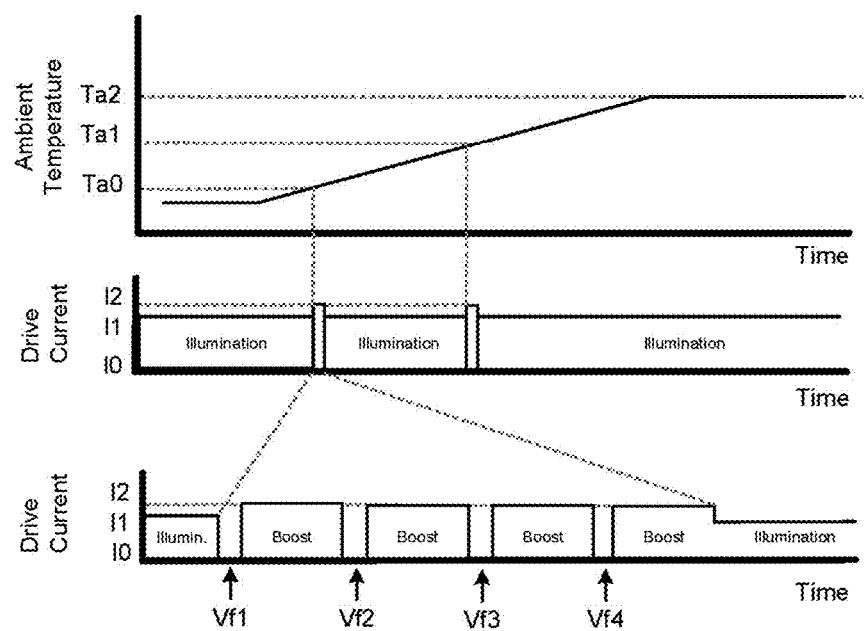
FIG. 8 is a graphical representation of an alternative embodiment of the compensation method shown in FIG. 5, in which forward voltages are only measured upon detecting a significant change in ambient temperature to avoid brightness banding, and drive currents are increased during the compensation period to avoid flicker.
Figure 9:
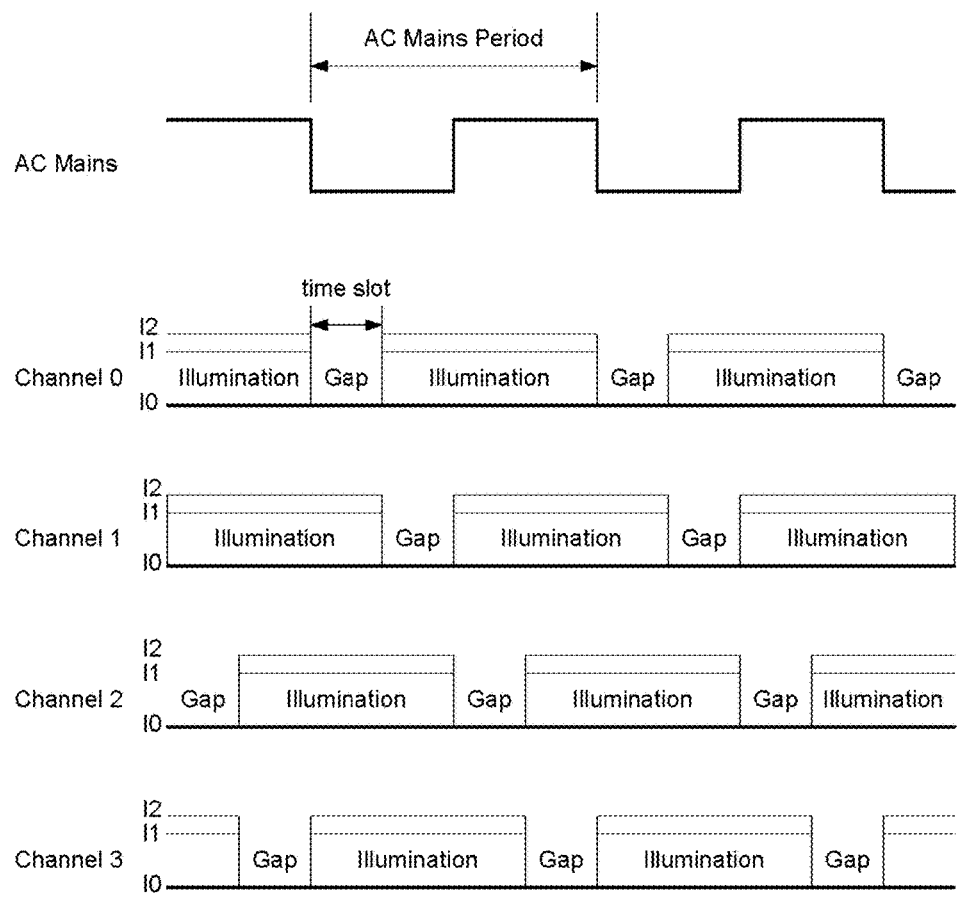
FIG. 9 an exemplary timing diagram for communicating optical data between illumination devices without producing flicker.

FIGS. 5-8 illustrate exemplary embodiments of an improved method for controlling an illumination device comprising a plurality of LEDs, and more specifically, for compensating individual LEDs of the illumination device to accurately account for variations in temperature and process. In general, the compensation method shown in FIG. 5 may begin by driving the plurality of LEDs substantially continuously to produce illumination (in step 30). As used herein, the term "substantially continuously" means that an operative drive current is supplied to the plurality of LEDs almost continuously, with the exception of periodic intervals during which the plurality of LEDs are momentarily turned off for short durations of time (in step 32). These periodic intervals may be utilized for obtaining operating forward voltage measurements during a compensation period (in step 34), as shown in the embodiments of FIGS. 5 and 7-8. These periodic intervals may also be used for other purposes, as shown in FIG. 9 and described below.

FIG. 7 is an exemplary timing diagram illustrating steps 30, 32 and 34 of the compensation method shown in FIG. 5, according to one embodiment of the invention. As shown in FIGS. 5 and 7, the plurality of LEDS are driven substantially continuously with operative drive current levels (denoted generically as I1 in FIG. 7) to produce illumination (in step 30 of FIG. 5). At periodic intervals, the plurality of LEDs are turned off for short durations of time (in step 32 of FIG. 5) by removing the drive currents, or at least reducing the drive currents to non-operative levels (denoted generically as I0 in FIG. 7). During each periodic interval in which the plurality of LEDs are turned off, one LED is driven with a relatively small, non-operative drive current (e.g., approximately 0.1-10 mA, not shown in FIG. 7) and the operating forward voltage developed across that LED is measured (e.g., Vf1, Vf2, Vf3 or Vf4). The forward voltage is measured across each LED, one LED at a time, and then the process repeats in the embodiment shown in FIG. 7. Between the periodic intervals, the illumination device produces continuous illumination with DC current supplied to the LEDs.

FIG. 7 provides an exemplary timing diagram for measuring the forward voltage developed across each LED in an illumination device comprising four LEDs, such as RGBY or RGBW. Although four LEDs are used in the embodiment of FIG. 7, the timing diagram and method described herein can easily be modified to accommodate a fewer or greater number of LEDs.

Once the operating forward voltage (Vfx) is measured from each LED, the compensation method shown in FIG. 5 determines the drive current (Ix) needed to achieve a desired luminous flux (Lx) from each LED using the operating forward voltages, the table of stored calibration values generated during the calibration method of FIG. 1 and one or more interpolation techniques (in step 36 of FIG. 5). For example, the compensation method may calculate a luminous flux value for the present forward voltage/operating temperature at each of the previously calibrated drive current levels by interpolating between the stored calibration values. Once a luminous flux value is calculated at each of the previously calibrated (i.e., known) drive current levels, another interpolation technique may be used to determine an unknown drive current needed to produce a desired luminous flux, should the desired luminous flux differ from one of the calculated luminous flux values.

FIG. 6 is a graphical illustration depicting how one or more interpolation technique(s) may be used to determine the drive current needed to produce a desired luminous flux from the stored calibration values. In FIG. 6, the six solid dots represent the luminous flux calibration values, which were obtained during the calibration phase at three different drive currents (I0, I1, and I2) and two different temperatures (T0 and T1) for each LED and stored within the table of calibration values shown, e.g., in FIG. 4. In the example used herein, the luminous flux calibration values (solid dots) were taken at 10%, 30% and 100% of the maximum drive current for a given LED at two different temperatures. The three X's represent luminous flux values, which are calculated during the compensation method at the same three drive currents (10%, 30% and 100% of the maximum drive current) for the present operating temperature (Tx). The value at each X is calculated, in one example, by interpolating between the stored calibration values. However, the exact interpolation technique used to determine the luminous flux value at each X may generally depend on the color of the LED being compensated.

For example, the luminous flux vs. junction temperature (or forward voltage) relationship for blue, green and white LEDs is substantially linear over the operating temperature range (see, FIG. 16). Because of this linear relationship, the compensation method is able to calculate luminous flux values at the present Vf (e.g., X values in FIG. 6) for blue, green and white LEDs by linearly interpolating between the calibration values stored at each drive current. However, red, red-orange and yellow LEDs exhibit a substantially non-linear relationship between luminous flux vs. junction temperature (see, FIG. 17). For these LEDs, a higher-order interpolation technique may be used to determine the luminous flux values at the present Vf (e.g., X values in FIG. 6) for each drive current.

In one embodiment, the higher-order interpolation technique may be in the form of a quadratic interpolation, which follows the general equation:

$$ax^2+bx+c=y \qquad \text{EQ. 1}$$

where 'x' is Vf (or temperature), 'y' is luminous flux, and 'a,' 'b' and 'c' are coefficients. If forward voltage and luminous flux values were previously obtained during the calibration phase at three different temperatures, the 'a,' 'b' and 'c' coefficient values may be precisely determined by inserting the stored calibration values into EQ. 1 and separately solving the equation for 'a,' 'b' and 'c'. If, on the other hand, the LED was calibrated at only two different temperatures, the 'a' coefficient may be obtained from data sheets provided by the LED manufacturer, while the 'b' and 'c' coefficients are determined from the calibration values, as described above. While the latter method (sometimes referred to as a "poor man's quadratic interpolation") may sacrifice a small amount of accuracy, it may in some cases represent an acceptable trade-off between accuracy and calibration costs.

Figure 19:
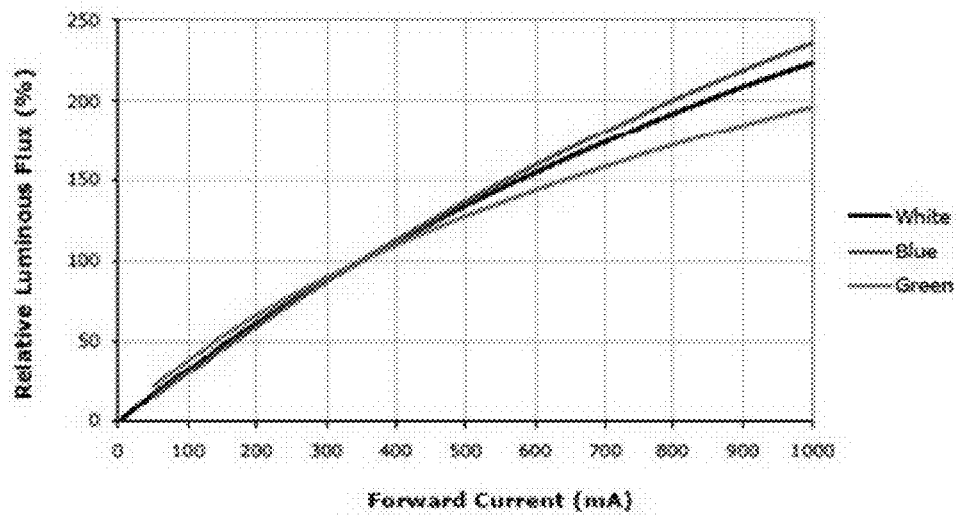
FIG. 19 is a graph illustrating the substantially more non-linear relationship between relative luminous flux and forward current for white, blue and green LEDs.
Figure 20:
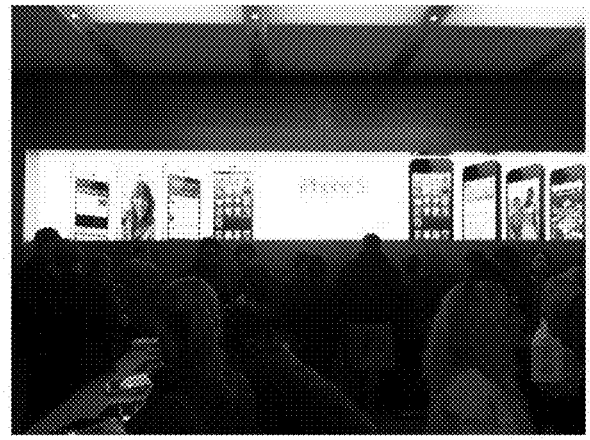
FIG. 20 is a photograph of a display backlit with an array of LEDs and illustrates what the human eye sees during operation of the display.

In some embodiments, a relationship (solid black line in FIG. 6) between the luminous flux values calculated at the three X's may be determined through another interpolation technique, if a desired luminous flux (Lx) differs from one of the calculated values. However, since the relationship between luminous flux and drive current is non-linear for all LED colors (see, FIGS. 18-19), the relationship may be derived, in some embodiments, through a higher-order interpolation of the calculated luminous flux values. Alternatively, a piece-wise linear interpolation could be used to characterize the non-linear relationship between the calculated luminous flux values, or a typical curvature could be assumed from data sheets provided by the LED manufacturer.

In some embodiments, an appropriate interpolation technique may be selected based on trade-offs between memory and processing requirements, and/or based upon the particular color of LED being compensated. As noted above, some LED colors, such as blue and green, exhibit a comparatively more non-linear luminous flux vs. drive current relationship than other LED colors, such as red and red-orange (see, FIGS. 18-19). LED colors exhibiting substantially greater non-linear behaviors (such as blue and green) may be more accurately compensated by obtaining more luminous flux calibration values and using a piece-wise linear interpolation technique, or by obtaining fewer calibration values and using a higher-order interpolation technique or an assumed curvature to generate the non-linear relationship between luminous flux and drive current.

Once the relationship between luminous flux and drive current is derived for a given LED, the drive current (Ix) needed to produce a desired luminous flux (Lx) may be selected from the generated relationship, as shown in the example of FIG. 6. The selected drive current may then be used to drive the LED to produce illumination having the desired luminous flux (in step 38 of FIG. 5). This process is then repeated for each of the plurality of LEDs, until each is configured for producing a desired luminous flux at the present operating temperature. The drive currents supplied to the LEDs may be adjusted to meet the selected drive currents either by adjusting the drive current level (i.e., current dimming), or by changing the duty cycle of the drive current through Pulse Width Modulation (PWM) dimming.

As with the calibration method of FIG. 1, the compensation method shown in FIG. 5 provides many advantages over conventional compensation methods. For example, the present compensation method uses a relatively small drive current to obtain operating forward voltage measurements from each LED individually, while turning off all emission LEDs not currently under test. This improves the accuracy of the operating forward voltage values and enables each LED to be individually compensated for temperature and process. Unlike conventional methods, some of which rely on typical values or linear relationships between luminous flux and drive current, the compensation method described herein derives a non-linear relationship between luminous flux and drive current for each LED at the present operating temperature (or Vf) using the stored calibration values taken at the different temperatures during the calibration process. This enables the present compensation method to precisely characterize the luminous flux vs. drive current relationship for each LED, and provide accurate temperature compensation, regardless of process. As a consequence, the compensation method described herein is able to more precisely control the luminous flux (if the LEDs are all of the same color), or the luminous flux and color point (if the illumination device comprises two or more differently colored LEDs).

Figure 21:
FIG. 21 is a photograph of the same display taken at a higher shutter speed to illustrate the bright and dark bands that develop across the display screen when LEDs within the array are periodically turned on/off.

A further advantage of the present compensation method is the ability to provide accurate temperature compensation while avoiding undesirable visible artifacts in the generated light. One undesirable artifact, called "brightness banding," often occurs whenever LEDs are periodically turned on and off for any reason, even at imperceptibly high rates. This banding artifact is demonstrated in the photograph of FIG. 21 and described above as alternating bands of light and dark areas on a display screen backlit by an array of LEDs. The bright and dark bands that develop across the display screen may occur whenever light emitted by the LEDs is modulated or turned on/off for any reason, such as when obtaining forward voltage measurements for temperature compensation or when modulating light output to communicate optical data in visible light communication (VLC) systems.

Another visual artifact, called "flicker," may occur during times when the LEDs are periodically turned off to measure forward voltage or communicate optical data. When the LEDs are turned off, the amount of light produced by the illumination device decreases, and when the LEDs are turned back on, the amount of light produced by the illumination device increases. This phenomenon may cause the illumination device to appear to flicker in either brightness and/or color. A solution for avoiding brightness banding and flicker during temperature compensation is illustrated in FIGS. 5 and 8. A solution for avoiding flicker in a VLC system is illustrated in FIG. 9.

In some embodiments, the compensation method described herein may achieve a desired luminous flux and/or color point from an illumination device, while avoiding undesirable visual artifacts, such as brightness banding and flicker. Such embodiments are illustrated in the optional method steps of FIG. 5 and the timing diagrams of FIG. 8.

As shown in the uppermost graph of FIG. 8, the ambient temperature (Ta) surrounding an illumination device increases steadily over time during operation of the device, until the temperature stabilizes (e.g., at Ta2). Since it is only necessary to perform the compensation method while the ambient temperature changes, alternative embodiments of the compensation method described herein may determine if there has been a significant change in ambient temperature (in optional step 31 of FIG. 5) before proceeding with steps 32-38. A "significant change" may be any incremental increase or decrease in ambient temperature. For example, a "significant change" may be a 1° C. increase or decrease in temperature. Other temperature increments may be used in other examples.

At specific increments of ambient temperature (e.g., 1° C.), the plurality of LEDs are turned off for short durations of time (in step 32 of FIG. 5), and the LED forward voltages (e.g., Vf1, Vf2, Vf3, and Vf4 of FIG. 8) are measured using a relatively small drive current (in step 34 of FIG. 5). New LED drive currents are calculated and applied to compensate for the change in temperature (in steps 36-38 of FIG. 5). However, once the ambient temperature stabilizes ("No" branch of step 31 of FIG. 5; Ta2 in the uppermost graph of FIG. 8), forward voltage measurements are no longer needed and the LEDs are driven to produce continuous illumination so that brightness banding does not occur.

In addition to brightness banding, FIG. 8 provides a solution for avoiding flicker during the times when the LEDs are periodically turned off to measure forward voltage. When forward voltage is measured from a given LED, all other emission LEDs are turned off to avoid inducing photocurrents within the LED under test. Because the amount of light produced by the illumination device decreases when the LEDs are turned off, and increases when the LEDs are turned back on, the illumination device may appear to flicker in brightness and/or color. The flicker phenomenon is avoided in the present compensation method by increasing the drive currents supplied to the LEDs by a small amount when the LEDs are turned on during the compensation period (in optional step 35 of FIG. 5). This is illustrated graphically in the two lowermost graphs of FIG. 8.

As shown in the two lowermost graphs of FIG. 8, the LEDs are driven with a first drive current level (denoted generically as I1) to produce continuous illumination. During the compensation period (shown most clearly in the bottom graph of FIG. 8), the LEDs are momentarily and periodically turned off to take forward voltage measurements (e.g., Vf1, Vf2, Vf3, and Vf4) from each LED, one LED at a time. Whenever the plurality of LEDs are turned on during the compensation period, the drive currents supplied to the plurality of LEDs are increased or boosted to a second drive current level (denoted generically as I2). By increasing the drive currents supplied to the plurality of LEDs by a small amount when the LEDs are turned on during the compensation period, the compensation method described herein avoids flicker by compensating for the lack of illumination when the LEDs are periodically turned off during the compensation period.

When current dimming techniques are used to control the illumination device, as shown in FIG. 8, flicker may be avoided by increasing the drive current level by approximately 1-10% during the compensation period, such that I2 is substantially 1-10% greater than I1. When PWM dimming techniques are used to control the illumination device (not shown), the duty cycle of the drive current may also be increased by approximately 1-10% during the compensation period to avoid flicker.

Brightness banding and flicker may also occur whenever light emitted by the LEDs is modulated to communicate optical data in visible light communication (VLC) systems. One example of a VLC system is described U.S. Publication No. 2011/0069960, which is assigned to the present inventor and incorporated by reference herein. In this patent, LEDs are used for producing illumination, transmitting and receiving optical data, detecting ambient light and measuring output characteristics of other LEDs. Synchronized timing signals are supplied to the LEDs to produce time division multiplexed communication channels in which data is communicated optically by the same LEDs that produce illumination. In one embodiment, the timing signals are synchronized in frequency and phase to a common source, preferentially to the AC mains, so that the LEDs within the illumination devices can be periodically turned off in synchronization with the AC mains to produce a plurality of time slots in a first communication channel for communicating optical data. Additional communication channels may be generated when additional timing signals are synchronized to the same frequency, but different phase, used to produce the first communication channel. During these time slots, data may be communicated optically between illumination devices when one device produces light modulated with data, while the LEDs of other illumination devices are configured to detect and receive the optically communicated data. In addition to communicating optical data, the time slots may be used for other purposes. For example, one or more of the LEDs can be configured to measure ambient light or an output characteristic (e.g., forward voltage, luminous flux or chromacity) from other LEDs in the illumination device during the time slots.

Brightness banding and flicker occur in VLC systems, such as the one described in U.S. Publication No. 2011/0069960, whenever the LEDs of an illumination device are periodically turned off to receive data, measure ambient light or measure output characteristics from other LEDs during the time slots. In some cases, brightness banding may be reduced by limiting VLC communications to short period(s) of time. For example, VLC may only occur periodically, only when initiated manually by a user or automatically by a controlling system, or only at designated times, such as during start-up when the illumination device is initially turned on. In other cases, brightness banding may be reduced by restricting the use of VLC to certain applications. For example, VLC may be limited to commissioning a set of illumination devices (e.g., establishing groupings of devices, setting addresses and output characteristics of the devices, etc.) included in a lighting system. A solution for avoiding the flicker phenomenon in a VLC system is illustrated in FIG. 9.

FIG. 9 is an exemplary timing diagram for communicating optical data between illumination devices without producing flicker. In particular, FIG. 9 illustrates a relationship between the AC mains timing (typically 50 or 60 Hz) and four different communication channels labeled Channel 0 through Channel 3. The communication channels are generated by driving a plurality of LEDs substantially continuously with drive currents configured to produce illumination, and periodically turning the plurality of LEDs off for short durations of time to produce gaps within the illumination, or time slots, within which data can be communicated optically or measurements can be taken. In this example, Channels 0 through 3 provide a plurality of communication gaps or time slots having different non-overlapping phases relative to the AC mains timing.

In this example, the four communication channels comprise alternating illumination and gap times. During illumination times, light from an illumination device may be on continually to produce a maximum brightness, or Pulse Width Modulated (PWM) to produce less brightness. During the periodic time slots, data can be sent from one device to any or all other devices, or measurements can be taken. In this example, the time slot duration is one quarter of the AC mains period, which enables four data bytes to be communicated at an instantaneous bit rate of 60 Hz×4×32, or 7.68K bits per second, with an average bit rate of 1.92K bits per second for each channel.

In order to avoid the flicker phenomenon, the drive currents supplied to the plurality of LEDs may be increased by a small amount (e.g., about 1-10%) when the LEDs are turned on for producing illumination, thereby compensating for the lack of illumination when the LEDs are periodically turned off to receive optical data or take measurements. This is illustrated in FIG. 9 by increasing the current level from I1 to I2 over the entire illumination period between each of the gap times. If PWM dimming is used (not shown) instead of current dimming, the duty cycle of the drive current supplied to each of the LEDs during the illumination periods may be increased by about 1-10% to avoid flicker.

Although the timing diagram of FIG. 9 appears to indicate that the same drive currents (I1 and I2) are supplied to the plurality of LEDs to produce illumination, one skilled in the art would understand that the plurality of LEDs may each be driven with a respective drive current deemed appropriate for that particular LED. For example, each LED may be driven with a drive current needed to produce a desired luminous flux from that LED, regardless of process and temperature variations. The individual drive currents needed to drive each LED may be determined and applied according to the method steps shown in FIG. 5, and may be increased by approximately 1-10% during the illumination periods shown in FIG. 9 to avoid flicker during times of VLC communications.

Figure 10:
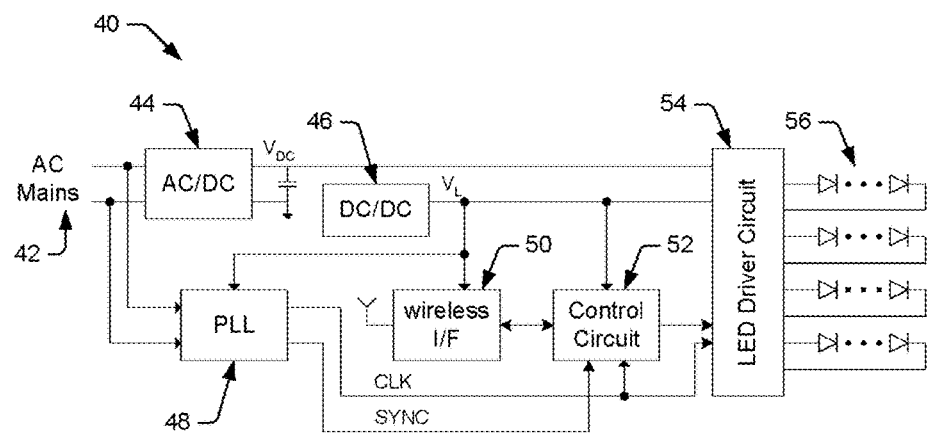
FIG. 10 is an exemplary block diagram of an illumination device, according to one embodiment of the invention.

FIG. 10 is one example of a block diagram of an illumination device 40, which is configured to accurately maintain a desired luminous flux and/or a desired color point over variations in temperature and process. The illumination device illustrated in FIG. 10 provides one example of the hardware and/or software that may be used to implement the calibration and compensation methods shown respectively in FIGS. 1 and 5.

In the illustrated embodiment, illumination device 40 is connected to AC mains 42 and comprises an AC/DC converter 44, a DC/DC converter 46, a phase locked loop (PLL) 48, a wireless interface 50, a control circuit 52, a driver circuit 54 and a plurality of LEDs 56. The LEDs 56, in this example, comprise four chains of any number of LEDs. In typical embodiments, each chain may have 2 to 4 LEDs of the same color, which are coupled in series and receive the same drive current. In the illustrated embodiment, the LEDs 56 may include a chain of red LEDs, a chain of green LEDs, a chain of blue LEDs, and a chain of yellow LEDs. The present invention is noted limited to any particular number of LED chains, any particular number of LEDs within the chains, or any particular color or combination of LED colors. However, the present invention may be particularly well suited when one or more different colors of LEDs are included within the illumination device 40.

In the illustrated embodiment, the AC/DC converter 44 converts AC mains power (e.g., 120V or 240V) to a DC voltage (labeled $V_{DC}$ in FIG. 10), which is supplied to the driver circuit 54 for producing the respective drive currents for LEDs 56. The DC/DC converter 46 converts the DC voltage $V_{DC}$ (e.g., 15V) to a lower voltage $V_L$ (e.g., 3.3V), which may be used to power the low voltage circuitry included within the illumination device, such as PLL 48, wireless interface 50, and control circuit 52.

In the illustrated embodiment, the PLL 48 locks to the AC mains frequency (50 or 60 HZ) and produces a high speed clock (CLK) signal and a synchronization signal (SYNC). The CLK signal provides the timing for the control circuit 52 and the driver circuit 54. In one example, the CLK signal is in the tens of mHz range (e.g., 23 MHz), and is precisely synchronized to the AC Mains frequency and phase. The SNYC signal is used by the control circuit 52 to create the timing used to obtain the forward voltage measurements. In one example, the SNYC signal frequency is equal to the AC Mains frequency (e.g., 50 or 60 HZ) and also has a precise phase alignment with the AC Mains.

In some embodiments, the wireless interface 50 may be used to calibrate the illumination device 40 during manufacturing. For example, an external production calibration tool (not shown) could communicate luminous flux measurements and other information to a device under test via the wireless interface 50. The calibration values may then be stored within a storage medium of the control circuit 52, for example. However, the wireless interface 50 is not limited to receiving only calibration data, and may be used for communicating information and commands for many other purposes. For example, the wireless interface 50 could be used during normal operation to communicate commands used to control the illumination device 40 or to obtain information about the illumination device. For example, commands may be communicated to the illumination device 40 via the wireless interface 50 to turn the illumination device on/off, to control the dimming and/or color of the illumination device, to initiate forward voltage measurements, or to store measurement results in memory. In other examples, the wireless interface 50 may be used to obtain status information or fault condition codes associated with the illumination device 40.

In some embodiments, the wireless interface 50 could operate according to ZigBee, WiFi, Bluetooth, or any other proprietary or standard wireless data communication protocol. In other embodiments, the wireless interface 50 could communicate using radio frequency (RF), infrared (IR) light or visible light. In alternative embodiments, a wired interface could be used, in place of the wireless interface 50 shown, to communicate information, data and/or commands over the AC mains or a dedicated conductor or set of conductors.

Using the timing signals received from the PLL 48, the control circuit 52 calculates and produces values indicating the desired drive current to be used for each LED chain 56. This information may be communicated from the control circuit 52 to the driver circuit 54 over a serial bus conforming to a standard, such as SPI or I2C, for example. In addition, the control circuit 52 may provide a latching signal that instructs the driver circuit 54 to simultaneously change the drive currents supplied to each of the LED 56 to prevent brightness and color artifacts.

In one embodiment, the control circuit 52 may include a storage medium (e.g., non-volatile memory) for storing a table of calibration values correlating forward voltage and drive current to luminous flux at a plurality of different temperatures for each of the LEDs 56. The control circuit 52 may be configured for determining respective drive currents needed to achieve a desired luminous flux from each LED in accordance with the compensation method shown in FIG. 5 and described above. In some embodiments, the control circuit 52 may determine the respective drive currents by executing program instructions stored within the storage medium. Alternatively, the control circuit 52 may include combinatorial logic for determining the desired drive currents.

In general, the LED driver circuit 54 may include a number of driver blocks equal to the number of LED chains 56 included within the illumination device. In the exemplary embodiment discussed herein, LED driver circuit 54 comprises four driver blocks, each configured to produce illumination from a different one of the LEDs chains 56. The LED driver circuit 54 also comprises the circuitry needed to measure ambient temperature (optional) and forward voltage, and to adjust LED drive currents accordingly. Each driver block receives data indicating a desired drive current from the control circuit 52, along with a latching signal indicating when the driver block should change the drive current.

Figure 11:
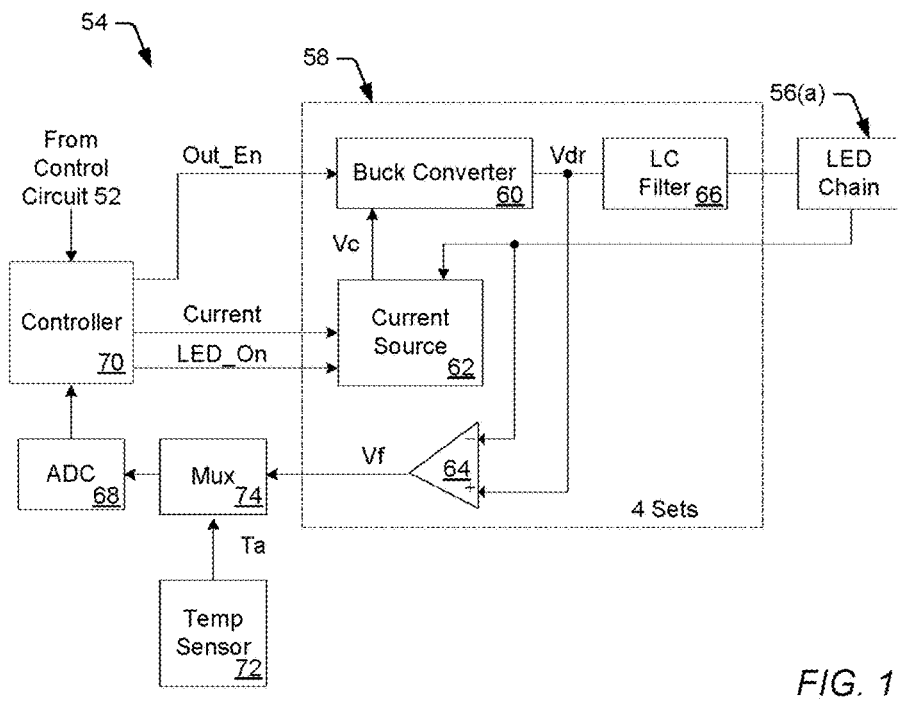
FIG. 11 is an exemplary block diagram of an LED driver circuit included within the illumination device of FIG. 10, according to one embodiment of the invention.

FIG. 11 is an exemplary block diagram of an LED driver circuit 54, according to one embodiment of the invention. As shown in FIG. 11, the driver circuit 54 includes four driver blocks, each block 58 including a buck converter 60, a current source 62, a difference amplifier 64, and an LC filter 66 for producing illumination and taking forward voltage measurements from a connected LED chain 56a. In addition, the LED driver circuit 54 includes an analog to digital converter (ADC) 68 for digitizing the output of the difference amplifiers 64 included within each driver block 58, and controller 70 for the control circuit 52 to use to adjust the current produced by the current source 62.

In some embodiments, the LED driver circuit 54 may include an optional temperature sensor 72 for taking ambient temperature (Ta) measurements, and a multiplexor (mux) 74 for multiplexing the ambient temperature (Ta) and forward voltage (Vf) measurements sent to the ADC 68. In some embodiments, the temperature sensor 72 may be a thermistor, and may be included on the driver circuit chip for measuring the ambient temperature surrounding the LEDs, or a temperature from a heat sink coupled to the LEDs. In other embodiments, the temperature sensor 72 may be an LED, which is used as both a temperature sensor and an optical sensor to measure ambient light conditions or output characteristics of the LED chains 56.

In some embodiments, the buck converter 60 may produce a pulse width modulated (PWM) voltage output (Vdr) when the controller 70 drives the "Out_En" signal high. This voltage signal (Vdr) is filtered by the LC filter 66 to produce a forward voltage on the anode of the connected LED chain 56a. The cathode of the LED chain is connected to the current source 62, which forces a fixed drive current equal to the value provided by the "Current" signal through the LED chain 56a when the "Led_On" signal is high. The Vc signal from the current source 62 provides feedback to the buck converter 60 to output the proper duty cycle and minimize the voltage drop across the current source 62. The difference amplifier 64 produces a signal relative to ground that is equal to the forward voltage (Vf) drop across the LED chain 56a during forward voltage measurements. The ADC 68 digitizes the forward voltage (Vf) output from the difference amplifier 64 and provides the result to the controller 70. The controller 70 determines when to take forward voltage measurements and produces the Out_En, Current, and Led_On signals.

In some embodiments, such as those shown in FIGS. 8 and 9 and the optional method steps of FIG. 5, the forward voltage (Vf) output from the difference amplifier 64 may be multiplexed with the ambient temperature (Ta) output from the temperature sensor 72 and connected to the ADC 68. In these embodiments, the ADC 68 digitizes the temperature sensor and difference amplifier outputs and provides the results to the controller 70. The controller 70 determines when to take the temperature and forward voltage measurements and produces the Out_En, Current, and Led_On signals.

Figure 12:
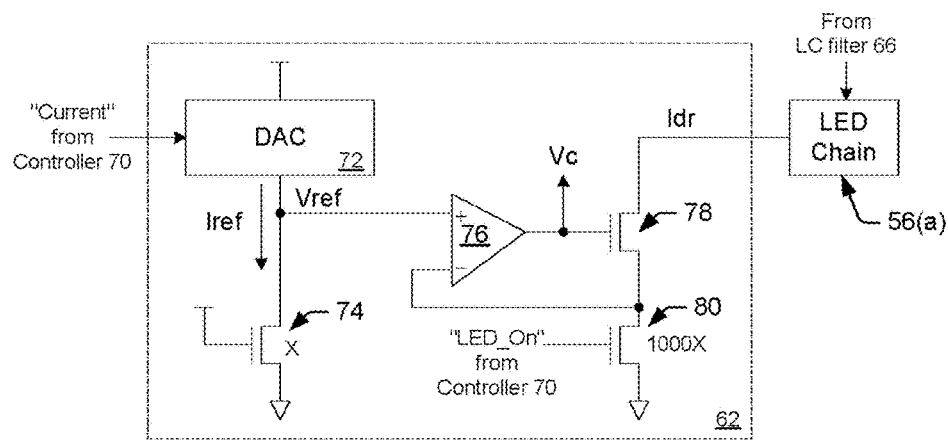
FIG. 12 is an exemplary block diagram of a current source included within the driver circuit of FIG. 11, according to one embodiment of the invention.

FIG. 12 is an exemplary block diagram of the current source 62 shown in FIG. 11, according to one embodiment of the invention. As shown in FIG. 12, the current source 62 includes a current digital to analog converter (DAC) 72 that is connected to ground through an N-channel Field Effect Transistor (NFET) 74, an error amplifier 76, and stack of two NFETs 78 and 80, which are connected to the cathode of the LED chain 56a. The DAC is coupled for receiving the "Current" signal from the controller 70 and for producing a reference current (Iref). The NFET 74 coupled to the DAC operates as a resistor to generate a reference voltage (Vref) for the error amplifier 76. The gate of the top NFET 78 provides the Vc signal, which is input to the buck converter 60 to adjust the voltage on the LED chain anode to a minimum needed by the current source 62.

In the current source 62 of FIG. 12, the error amplifier 76 adjusts the gate of the top NFET 78 until the drain voltage of the bottom NFET 80 is the same as the reference voltage (Vref). The impedance of the bottom NFET 80 is precisely 1/1000th that of NFET 74 when the "Led_On" signal is high. This forces the drive current (Idr) through the LED chain 56a to be precisely 1000 times the value of the reference current (Iref) generated by the current DAC 72. The value of the drive current is adjusted through the "Current" signal provided by the controller 70. In some embodiments, the reference current (Iref) generated by the DAC 72 may range from about 0.1 uA to about 1 mA, so that the LED drive current (Idr) can range between about 1 mA to about 1 A. As indicated above, a 0.1 mA-10 mA drive current setting is preferably used during forward voltage measurements, while substantially greater drive current settings (e.g., about 20 mA to about 500 mA) are used to produce illumination from the LED chain 56a.

Figure 13:
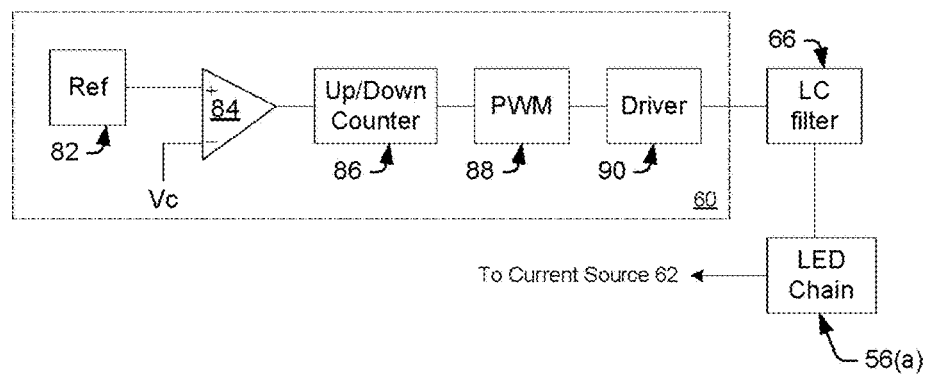
FIG. 13 is an exemplary block diagram of a buck converter included within the driver circuit of FIG. 11, according to one embodiment of the invention.
Figure 14:
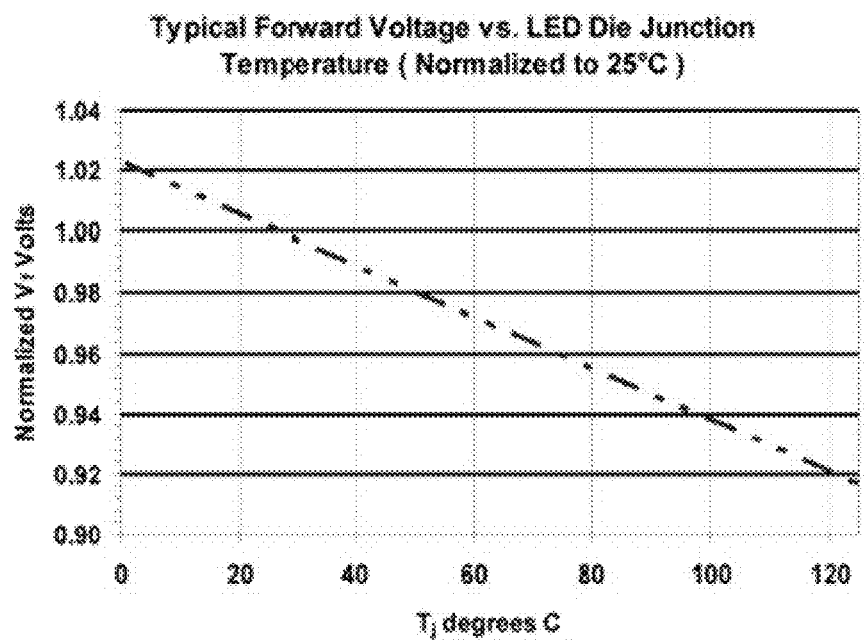
FIG. 14 is a graph illustrating typical forward voltage vs. LED die junction temperature (normalized to 25° C.)
Figure 15:
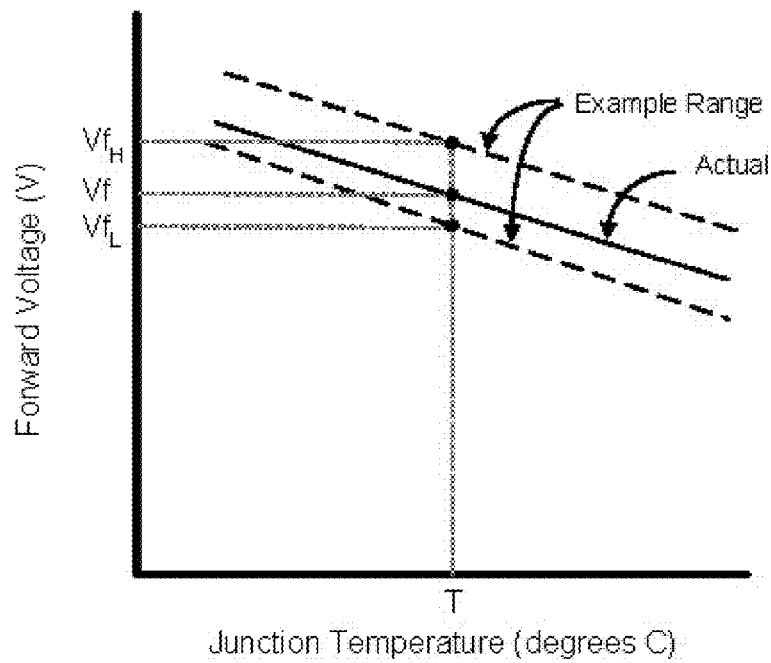
FIG. 15 is a graph illustrating how the magnitude and slope of the line correlating forward voltage to junction temperature can vary significantly between LED manufacturers, LED part numbers and even individual LEDs arranged side by side on the same chip.

FIG. 13 is an exemplary block diagram of a buck converter 60, according to one embodiment of the invention. As shown in FIG. 13, the buck converter 60 may include a reference voltage 82, a comparator 84, an up/down counter 86, a pulse width modulator (PWM) 88, and a driver 90. The comparator 84 compares the Vc signal from the current source 62 to the reference voltage 82 and produces an output, which causes the up/down counter 86 to increment or decrement whenever the Vc signal is lower or higher, respectively, than the fixed reference voltage 82. The up/down counter 86 operates as an integrator in the loop that adjusts the filtered buck converter output (LED chain anode) to a level that causes the Vc signal voltage to equal the reference voltage 82. The pulse width modulator 88 produces a PWM clock signal that has a duty cycle equal to the value in the up/down counter 86. When the "Out_En" signal is supplied to the driver 90 (FIG. 13) and the "Led_On" signal supplied to the current source 62 (FIG. 12) are both high, the driver 90 applies the PWM clock signal to the LC filter 66, which converts the PWM clock signal to a relatively constant voltage proportional to the duty cycle of the clock.

When the "Out_En" signal is low, the driver 90 is tri-stated. If the "Led_On" signal supplied to the current source 62 (see, FIG. 12) is high while "Out_En" is low, the LED drive current will cause the capacitor within the LC filter 66 to discharge. If the "Led_On" signal is low while "Out_En" signal is high, the buck converter 60 will charge the capacitor within the LC filter 66.

During forward voltage measurement times, the buck converters 60 and the current sources 62 connected to all LED chains that are not being measured, should be turned off at the same time by simultaneously applying low "Led_On" and "Out_En" signals to these LEDs. Since no current will be flowing through these LEDs, the LC capacitor voltage should not change during the forward voltage measurement times. Since no time is needed for the buck converter to settle, there should be no LED current transients to produce visible artifacts.

During forward voltage measurement times, the buck converter 60 connected to the LED chain under test should also be turned off to prevent the switching noise of the buck converter from interfering with the forward voltage measurement. While the current source 62 connected to this LED chain should remain on, the drive current (Idr) should be switched from the operating current level (e.g., about 20 mA to about 500 mA) to the relatively small drive current level used to take forward voltage measurements (e.g., about 0.1 mA-10 mA). Because this small drive current level will naturally cause the voltage on the LC capacitor to droop, the buck converter 60 should remain on for one or more PWM cycles after the LED current is switched to the relatively small drive current, but before the forward voltage measurements are taken. This enables the LC capacitor voltage to charge by a small amount to compensate for the voltage droop during the forward voltage measurement.

One implementation of an improved illumination device 40 has now been described in reference to FIGS. 10-13. A skilled artisan would understand how the illumination device could be alternatively implemented within the scope of the present invention.

It will be appreciated to those skilled in the art having the benefit of this disclosure that this invention is believed to provide an improved illumination device and improved methods for calibrating and compensating individual LEDs in the illumination device, so as to maintain a desired luminous flux and/or a desired color point over variations in temperature and process. Further modifications and alternative embodiments of various aspects of the invention will be apparent to those skilled in the art in view of this description. It is intended, therefore, that the following claims be interpreted to embrace all such modifications and changes and, accordingly, the specification and drawings are to be regarded in an illustrative rather than a restrictive sense.

What is claimed is:

1. A method for calibrating an illumination device comprising at least a first light emitting diode (LED), the method comprising:

subjecting the first LED to a first ambient temperature;

measuring a forward voltage developed across the first LED upon applying a non-operative drive current ranging between 0.1 mA and 10 mA to the first LED while turning off all other LEDs in the illumination device, wherein when all other LEDs are turned off occurs in time slots between when the illumination device produces illumination;

detecting at least a first, a second and a third luminous flux output from the first LED upon successively applying at least a first, a second and a third drive current to the first LED, wherein the first, the second and the third drive currents are each operative drive currents and are different from one another and substantially greater than the non-operative drive current, wherein the first drive current is substantially equal to a maximum drive current of approximately 500 mA; and storing results of the measuring and detecting steps within the illumination device to calibrate the first LED at the first ambient temperature.

2. The method as recited in claim 1, further comprising:

subjecting the first LED to a second ambient temperature, which is different from the first ambient temperature; and repeating the steps of measuring, detecting and storing to calibrate the first LED at the second ambient temperature.

3. The method as recited in claim 2, wherein the illumination device comprises a plurality of LEDs including the first LED, and wherein the method is performed for each of the plurality of LEDs.

4. The method as recited in claim 2, wherein the steps of subjecting the first LED to the first and second ambient temperatures occur naturally during production of the illumination device.

5. The method as recited in claim 2, wherein one of the first and second ambient temperatures is substantially equal to room temperature, and the other of the first and second ambient temperatures is substantially greater than room temperature.

6. The method as recited in claim 1, wherein the second drive current is approximately 30% of the maximum drive current, and wherein the third drive current is approximately 10% of the maximum drive current.

7. The method as recited in claim 1, wherein the step of detecting comprises detecting a number, N, of luminous flux output from the first LED upon successively applying N different drive currents to the first LED, wherein the N different drive currents are each different from one another and substantially greater than the non-operative drive current, and wherein N is greater than or equal to 2.

8. The method as recited in claim 1, wherein the time slots are synchronized to an AC mains period and occupy a portion of said AC mains period.

9. The method as recited in claim 1, wherein the time slots occur between when the illumination device produces illumination through pulse width modulation.

10. An illumination device, comprising:
   a plurality of light emitting diode (LED) chains;
   a storage medium configured for storing a table of calibration values correlating forward voltage and drive current to luminous flux at a plurality of temperatures for each of the plurality of LED chains;
   wherein for each LED chain, the table of calibration values comprises:
      a first forward voltage value measured across the LED chain upon applying a non-operative drive current ranging between 0.1 mA and 10 mA to the LED chain when the LED chain is subjected to a first temperature while turning off all other LEDs in the illumination device, wherein when all other LEDs are turned off occurs in time slots between when the illumination device produces illumination;
      a second forward voltage value measured across the LED chain upon applying the non-operative drive current to the LED chain when the LED chain is subjected to a second temperature while turning off all other LEDs in the illumination device, wherein when all other LEDs are turned off occurs in time slots between when the illumination device produces illumination;
      a first plurality of luminous flux values detected from the LED chain based on a plurality of different operative drive currents when the LED chain is subjected to the first temperature;
      a second plurality of luminous flux values detected from the LED chain based on the plurality of different operative drive currents when the LED chain is subjected to the second temperature; and
   an interface for receiving the calibration values from a calibration tool.

11. The illumination device as recited in claim 10, wherein the interface is a wireless interface configured to communicate information via a radio frequency (RF), an infrared (IR) light or a visible light.

12. The illumination device as recited in claim 11, wherein the wireless interface is configured to operate according to at least one of ZigBee, WiFi, or Bluetooth communication protocols.

13. The illumination device as recited in claim 10, wherein the interface is a wired interface, which is configured to communicate over an AC mains, a dedicated conductor or a set of conductors.

14. The method as recited in claim 10, wherein the time slots are synchronized to an AC mains period and occupy a portion of said AC mains period.

15. The method as recited in claim 10, wherein the time slots occur between when the illumination device produces illumination through pulse width modulation.

* * * * *